(12) United States Patent
Tanaka et al.

(10) Patent No.: US 10,443,794 B2
(45) Date of Patent: Oct. 15, 2019

(54) PLANAR LIGHT SOURCE AND ILLUMINATION APPARATUS

(71) Applicant: KANEKA CORPORATION, Osaka-shi, Osaka (JP)

(72) Inventors: Michiru Tanaka, New York, NY (US); Akane Nakabayashi, New York, NY (US); Naoko Jonoo, Tokyo (JP); Ko Fujisawa, Tokyo (JP)

(73) Assignee: KANEKA CORPORATION, Osaka-shi, Osaka (JP)

( * ) Notice: Subject to any disclaimer, the term of this patent is extended or adjusted under 35 U.S.C. 154(b) by 0 days.

(21) Appl. No.: 15/759,936

(22) PCT Filed: Dec. 2, 2016

(86) PCT No.: PCT/JP2016/085959
§ 371 (c)(1),
(2) Date: Mar. 14, 2018

(87) PCT Pub. No.: WO2018/100741
PCT Pub. Date: Jun. 7, 2018

(65) Prior Publication Data
US 2019/0049076 A1 Feb. 14, 2019

(51) Int. Cl.
*F21S 2/00* (2016.01)
*F21V 11/08* (2006.01)
(Continued)

(52) U.S. Cl.
CPC ............ *F21S 2/005* (2013.01); *F21S 8/033* (2013.01); *F21V 11/00* (2013.01); *F21V 11/08* (2013.01);
(Continued)

(58) Field of Classification Search
CPC .. F21S 2/005; F21S 8/032; F21S 8/033; F21S 8/04; F21V 11/08; F21V 21/096;
(Continued)

(56) References Cited

U.S. PATENT DOCUMENTS

| 4,466,208 A | * | 8/1984 | Logan, Jr. | ............. G08B 7/062 40/465 |
| 2003/0026100 A1 | * | 2/2003 | Wang | ........................ F21L 4/00 362/321 |

(Continued)

FOREIGN PATENT DOCUMENTS

| JP | S51126988 U1 | 10/1976 |
| JP | S58073902 A | 5/1983 |

(Continued)

OTHER PUBLICATIONS

ISA Japan Patent Office, Written Opinion Issued in Application No. PCT/JP2016/085959, dated Mar. 7, 2017, WIPO, 5 pages.

(Continued)

*Primary Examiner* — Alan B Cariaso
(74) *Attorney, Agent, or Firm* — Alleman Hall Creasman & Tuttle LLP

(57) ABSTRACT

The present invention provides a planar light source and an illumination apparatus which have higher design property than that of conventional ones. The planar light source includes: a planar light emitting panel which has a light emitting surface; and a decorative member which covers the light emitting surface of the planar light emitting panel. A light emitting region which emits light when the planar light source is turned on and a non-light-emitting frame region which surrounds the light emitting region are provided on the light emitting surface. The decorative member has a pattern forming section. The pattern forming section includes a frame shielding section which covers entirety of the frame region in the front view, and a light-emission (Continued)

shielding section which extends from the frame shielding section so as to divide the light emitting region into a plurality of regions.

10 Claims, 34 Drawing Sheets

(51) Int. Cl.
| | |
|---|---|
| *F21V 21/096* | (2006.01) |
| *F21S 8/00* | (2006.01) |
| *F21V 11/00* | (2015.01) |
| *H01L 51/50* | (2006.01) |
| *F21S 8/04* | (2006.01) |
| *F21V 15/01* | (2006.01) |
| *F21W 121/00* | (2006.01) |
| *F21Y 105/00* | (2016.01) |
| *F21Y 115/20* | (2016.01) |
| *F21Y 115/15* | (2016.01) |

(52) U.S. Cl.
CPC ............ *F21V 21/096* (2013.01); *H01L 51/50* (2013.01); *F21S 8/032* (2013.01); *F21S 8/04* (2013.01); *F21V 15/01* (2013.01); *F21W 2121/00* (2013.01); *F21Y 2105/00* (2013.01); *F21Y 2115/15* (2016.08); *F21Y 2115/20* (2016.08)

(58) Field of Classification Search
CPC ..... F21V 11/00; F21V 15/01; F21W 2121/00; F21Y 2105/00; F21Y 2105/14; F21Y 2105/16; F21Y 2115/15; F21Y 2115/20; H01L 27/3283; H01L 27/3295; H01L 51/50; G09F 13/06; G09F 13/20; G09F 13/22; G09F 2013/225; G09F 2013/227
See application file for complete search history.

(56) References Cited

U.S. PATENT DOCUMENTS

| | | | |
|---|---|---|---|
| 2008/0037284 A1* | 2/2008 | Rudisill | F21S 2/005 |
| | | | 362/629 |
| 2009/0219718 A1 | 9/2009 | Sonobe | |
| 2009/0323349 A1 | 12/2009 | Ochiai | |
| 2010/0108998 A1 | 5/2010 | Verjans et al. | |
| 2011/0157893 A1* | 6/2011 | Ngai | F21S 2/00 |
| | | | 362/249.02 |
| 2012/0320615 A1* | 12/2012 | Englert | B60Q 1/323 |
| | | | 362/511 |
| 2013/0329438 A1 | 12/2013 | Wakahara et al. | |
| 2015/0267903 A1 | 9/2015 | Son | |
| 2017/0276317 A1 | 9/2017 | Nishikawa et al. | |
| 2018/0045384 A1* | 2/2018 | Uno | F21S 2/00 |
| 2019/0025651 A1* | 1/2019 | Sugiyama | G02F 1/133608 |

FOREIGN PATENT DOCUMENTS

| | | |
|---|---|---|
| JP | H02123439 U1 | 10/1990 |
| JP | H03008034 U1 | 1/1991 |
| JP | H06086204 U | 12/1994 |
| JP | 2003162918 A | 6/2003 |
| JP | 2003263901 A | 9/2003 |
| JP | 2006156205 A | 6/2006 |
| JP | 2014056751 A | 3/2014 |
| JP | 2015022872 A | 2/2015 |
| JP | 2016152157 A | 8/2016 |
| JP | 6012836 B1 | 9/2016 |
| JP | 2017090776 A | 5/2017 |
| WO | 2016021438 A1 | 2/2016 |

OTHER PUBLICATIONS

European Patent Office, Supplemental European Search Report Issued in Application No. 16915914, dated Oct. 15, 2018, Netherlands, 4 pages.

* cited by examiner

LONGITUDINAL CROSS-SECTIONAL VIEW

TRANSVERSE CROSS-SECTIONAL VIEW

TURN-ON STAT

TURN-OFF STATE

TURN-ON STATE

TURN-OFF STATE

TURN-ON STATE

TURN-OFF STATE

TURN-ON STATE

TURN-OFF STATE

ASANOHA

GOMA

SAKURA

SHOKKO

SAYAGATAKUZUSHI

IZUTSU WARIBISHI

WARIBISHI TUNAGI

MIEBISHI

SENBON GOUSHI

MASU GOSHI

SEIGAIHA

SHIPPO

KASANE RINDO

KAGOME

MITSUKUMITE KIKKO

FUNDO WATSUNAGI

TSUMIISHI KIKKO

PLANAR LIGHT SOURCE AND ILLUMINATION APPARATUS

TECHNICAL FIELD

The present invention relates to a planar light source and an illumination apparatus that emit light in a planar shape.

BACKGROUND ART

Conventionally, an organic EL panel has been used as a light source of an illumination apparatus (for example, Patent Document 1). Since the organic EL panel is a planar light source and has characteristics of being thin and lightweight, there are few restrictions on the installation place of the organic EL panel. Therefore, in recent years, application of the organic EL panel for a wall-surface illumination apparatus as well as for a ceiling illumination apparatus is considered. The wall-surface illumination apparatus is installed on a surface of a wall or the like. The ceiling illumination apparatus is installed on a ceiling.

The wall-surface illumination apparatus used for a surface of a wall or the like not only functions as illumination but also is used as part of an interior decoration. Therefore, high design property is required.

PRIOR ART DOCUMENT

Patent Document

Patent Document 1: JP 2016-152157 A

DISCLOSURE OF INVENTION

Technical Problem

Incidentally, a conventional ceiling illumination apparatus used for a ceiling is installed such that light from a light emitting region of the organic EL panel is not shielded by another member in order to maximize light intensity of planar light. Therefore, the shape of the light emitting region is the irradiation range of the planar light as it is. For example, in the case of an organic EL panel in which the shape of the light source is rectangular, the shape of the light emitting region is also rectangular, and rectangular planar light is emitted. Therefore, if the conventional ceiling illumination apparatus is adopted as a wall-surface illumination apparatus as it is, illumination is uninteresting and gives monotonous impression when the apparatus is turned on, and further improvement of design property has been demanded.

Therefore, an object of the present invention is to provide a planar light source and an illumination apparatus which have higher design property than that of conventional ones.

Solution to Problem

One aspect of the present invention for solving the above problem is a planar light source including: a planar light emitting panel having a light emitting surface; and a decorative member covering the light emitting surface of the planar light emitting panel, wherein the light emitting surface includes: a light emitting region emitting light when the planar light source is turned on; and a non-light-emitting frame region surrounding the light emitting region, wherein the decorative member has a pattern forming section, and wherein the pattern forming section includes in a front view: a frame shielding section covering an entire area of the frame region; and a light-emission shielding section extending from the frame shielding section so as to divide the light emitting region into a plurality of regions.

According to the present aspect, design property of the planar light emitting panel is higher than that of a conventional planar light emitting panel because light from the light emitting region is shielded by the pattern forming section of the decorative member, and light of a desired pattern is emitted.

According to the present aspect, since the frame shielding section hides the non-light-emitting frame region of the planar light emitting panel in the front view, the non-light-emitting frame region of the planar light emitting panel is not visually recognized from a user side. Therefore, the non-light-emitting frame region does not affect the external shape of the planar light emitting panel, and a desired appearance can be formed by the pattern forming section.

According to the present aspect, since the mechanical strength of the planar light emitting panel is reinforced by the frame shielding section surrounding the light emitting region of the decorative member and the light-emission shielding section dividing the light emitting region, warping or the like of the planar light emitting panel can be suppressed.

In a preferred aspect, the light-emission shielding section covers from 5% to 75% both inclusive of the light emitting region in a front view.

According to the present aspect, since the light-emission shielding section has a certain amount of area, it is possible to prevent trouble caused by a raise of panel temperature due to light-induced heat accumulated between the decorative member and the planar light emitting panel while sufficient mechanical strength is ensured.

In a preferred aspect, the decorative member includes a main body plate section having the pattern forming section, and a side-surface plate section bent from an end section of the main body plate section, the planar light emitting panel includes: a planar light emitting tile; and a frame member protecting the planar light emitting tile, the frame member is made of resin and has elasticity, and part of the frame member is sandwiched by an end surface of the planar light emitting tile and the side-surface plate section.

According to the present aspect, since part of the frame member having elasticity is sandwiched between the end surface of the planar light emitting tile and the side-surface plate section, the frame member can function as a buffer member and can absorb distortion due to thermal expansion of the planar light emitting tile. Therefore, even a planar light emitting tile having a thin glass panel as a supporting substrate is hard to break and has high safety.

In a preferred aspect, the planar light emitting panel constitutes one mirror surface together with the pattern forming section when the planar light source is turned off According to the present aspect, the planar light emitting panel can be used as one mirror when the planar light source is turned off.

In a preferred aspect, the pattern forming section has at least two of the light-emission shielding sections having an identical width, the at least two of the light-emission shielding sections dividing the light emitting region into at least three regions in a front view.

According to the present aspect, since the at least two light-emission shielding sections reinforce the light emitting region such that the light-emission shielding sections divide the light emitting region into three or more regions, the at least two light-emission shielding sections can function better as a crosspiece and warping or the like of the planar light emitting panel can be further protected.

In a preferred aspect, the pattern forming section has a plate shape and includes a plurality of light transmitting holes that allow light from the light emitting region to pass through.

According to the present aspect, since the pattern forming section includes the plurality of light transmitting holes through which light from the light emitting region can pass, it is possible to emit light having a shape matching the shapes of the light transmitting holes. That is, by forming the shapes of the light transmitting holes into a desired pattern, a desired pattern can be lit up.

In a preferred aspect, the light-emission shielding section includes a shielding extending section extending with a longitudinal component and a lateral component in a front view.

According to the present aspect, since the shielding extending section extends with the lateral component and the longitudinal component, the shielding extending section can reinforce the planar light emitting panel against warping, deflection, and the like in the longitudinal direction and the lateral direction.

In a preferred aspect, some of the regions divided by the light-emission shielding sections have a different shielding rate, the shielding rate being defined as a ratio of an area where the pattern forming section is covering the light emitting region to an total area of the light emitting region.

According to the present aspect, since regions having different shielding rates are contained in the regions obtained by dividing the light emitting region by the light-emission shielding section, a difference in light intensity is generated in the region of the planar light source when the planar light source is turned on, and it is easy to form a pattern when the planar light source is arranged side by side with another planar light source.

One aspect of the present invention is an illumination apparatus including: a first of the planar light source; and a second of the planar light source. The second of the planar light source has the pattern forming section that is different from the pattern forming section of the first of the planar light source. The first of the planar light source and the second of the planar light source are arranged to be adjacent to each other. The first of the planar light source and the second of the planar light source have a different shielding rate, the shielding rate being defined as a ratio of an area where the pattern forming section is covering the light emitting region to an total area of the light emitting region.

According to the present aspect, since the one planar light source and the other planar light source adjacent to each other have different shielding rates, a difference in light intensity of irradiation light is generated between the one planar light source and the other planar light source. Therefore, it is possible to form a pattern or a picture by using the difference in light intensity between the planar light sources, and to further improve design property.

In a preferred aspect, the pattern forming section of the first of the planar light source and the pattern forming section of the second of the planar light source form one pattern when the first of the planar light source and the second of the planar light source are turned on.

According to the present aspect, since one pattern can be formed by the difference in light intensity between the planar light sources, it is possible to further improve design property.

One aspect of the present invention is an illumination apparatus including: the above-described planar light source; and a mounting member that can be fixed to a mounting surface. The mounting member has one of a magnetic force generating section and a ferromagnetic section, whereas the planar light source has the other of the magnetic force generating section and the ferromagnetic section on a back surface side, the magnetic force generating section and the ferromagnetic section forming a pair with each other. The planar light source is fixed to the mounting member by magnetic force generated between the magnetic force generating section and the ferromagnetic section.

According to the present aspect, the planar light source is fixed to the mounting member by attractive force between the ferromagnetic section or the magnetic force generating section provided on the back surface of the planar light source and the magnetic force generating section or the ferromagnetic section of the mounting member. Therefore, the planar light source can be mounted to the mounting member without the light emitting surface being shielded by the ferromagnetic section and the magnetic force generating section.

Effect of Invention

The planar light source and the illumination apparatus of the present invention have higher design property than that of a conventional planar light source and a conventional illumination apparatus.

BRIEF DESCRIPTION OF DRAWINGS

FIGS. 5A and 5B are cross-sectional views of the planar light source illustrated in FIG. 2, wherein FIG. 5A is a longitudinal cross-sectional view, and FIG. 5B is a transverse cross-sectional view.

FIGS. 6A and 6B are explanatory views of the planar light emitting panel illustrated FIG. 3, wherein FIG. 6A is a front view, and FIG. 6B is a back view.

FIGS. 10A to 10C are front views illustrating each region of the decorative member illustrated in FIG. 9, wherein FIG. 10A illustrates entirety of the regions, FIG. 10B is a view which focuses on a first region, and FIG. 10C is a view which focuses on a second region.

FIGS. 11A and 11B are explanatory views of a planar light source according to the first embodiment of the present invention, wherein FIG. 11A is a front view of a planar light source different from the planar light source illustrated in FIG. 2, and FIG. 11B is a front view illustrating each region.

FIGS. 14A and 14B are plan views of the planar light source illustrated in FIG. 2, wherein FIG. 14A illustrates a turn-on state, and FIG. 14B illustrates a turn-off state. Note that a lighting part is indicated by dots.

FIGS. 15A and 15B are plan views of the illumination apparatus illustrated in FIG. 1, wherein FIG. 15A illustrates a turn-on state, and FIG. 15B illustrates a turn-off state. Note that a lighting part is indicated by dots.

FIGS. 22A to 22C are front views illustrating each region of the decorative member illustrated in FIG. 21, wherein FIG. 22A illustrates entirety of the regions, FIG. 22B is a view which focuses on a first region, and FIG. 22C is a view which focuses on a second region.

FIGS. 23A and 23B are plan views of the planar light source according to the third embodiment of the present invention, wherein FIG. 23A illustrates a turn-on state, and FIG. 23B illustrates a turn-off state. Note that a lighting part is indicated by dots.

FIGS. 25A and 25B are front views illustrating each region of the decorative member illustrated in FIG. 24, wherein FIG. 25A illustrates entirety of the regions, and FIG. 25B is a view which focuses on a first region.

FIGS. 26A and 26B are plan views of the planar light source according to the fourth embodiment of the present invention, wherein FIG. 26A illustrates a turn-on state, and FIG. 26B illustrates a turn-off state. Note that a lighting part is indicated by dots.

FIGS. 28A to 28C are front views illustrating each region of the decorative member illustrated in FIG. 27, wherein FIG. 28A illustrates entirety of the regions, FIG. 28B is a view which focuses on a first region, and FIG. 28C is a view which focuses on a second region.

FIGS. 29A and 29B are front views of planar light sources according to other embodiments of the present invention, wherein FIG. 29A illustrates a planar light source of a sixth embodiment, and FIG. 29B illustrates a planar light source of a seventh embodiment.

FIGS. 30A to 30C are front views of planar light sources according to other embodiments of the present invention, wherein FIG. 30A illustrates a planar light source of an eighth embodiment, FIG. 30B illustrates a planar light source of a ninth embodiment, and FIG. 30C illustrates a planar light source of a tenth embodiment.

FIGS. 34A to 34Q are front views of decorative members according to other embodiments of the present invention, wherein FIG. 34A illustrates a case of the asanoha (hemp leaf) pattern, FIG. 34Q illustrates a case of the tsumiishi kikko pattern (hexagonal pattern like piled rocks).

FIGS. 35A to 35D are front views of planar light sources according to other embodiments of the present invention, wherein FIG. 35A illustrates a front view of a planar light source in a turn-off state according to another embodiment, FIG. 35B illustrates a front view of the planar light source illustrated in FIG. 35A in a turn-on state, FIG. 35C illustrates a front view of a planar light source in a turn-off state according to an embodiment other than the embodiment illustrated in FIG. 35A, and FIG. 35D illustrates a front view of the planar light source illustrated in FIG. 35C in a turn-on state. Note that a lighting part is indicated by dots.

FIGS. 36A to 36D are front views of planar light sources according to other embodiments of the present invention, wherein FIG. 36A illustrates a front view of a planar light source in a turn-off state according to another embodiment, FIG. 36B illustrates a front view of the planar light source illustrated in FIG. 36A in a turn-on state, FIG. 36C illustrates a front view of a planar light source in a turn-off state according to an embodiment other than the embodiment illustrated in FIG. 36A, and FIG. 36D illustrates a front view of the planar light source illustrated in FIG. 36C in a turn-on state. Note that a lighting part is indicated by dots.

BEST MODE FOR CARRYING OUT THE INVENTION

Hereinafter, embodiments of the present invention will be described in detail.

Figure 1:
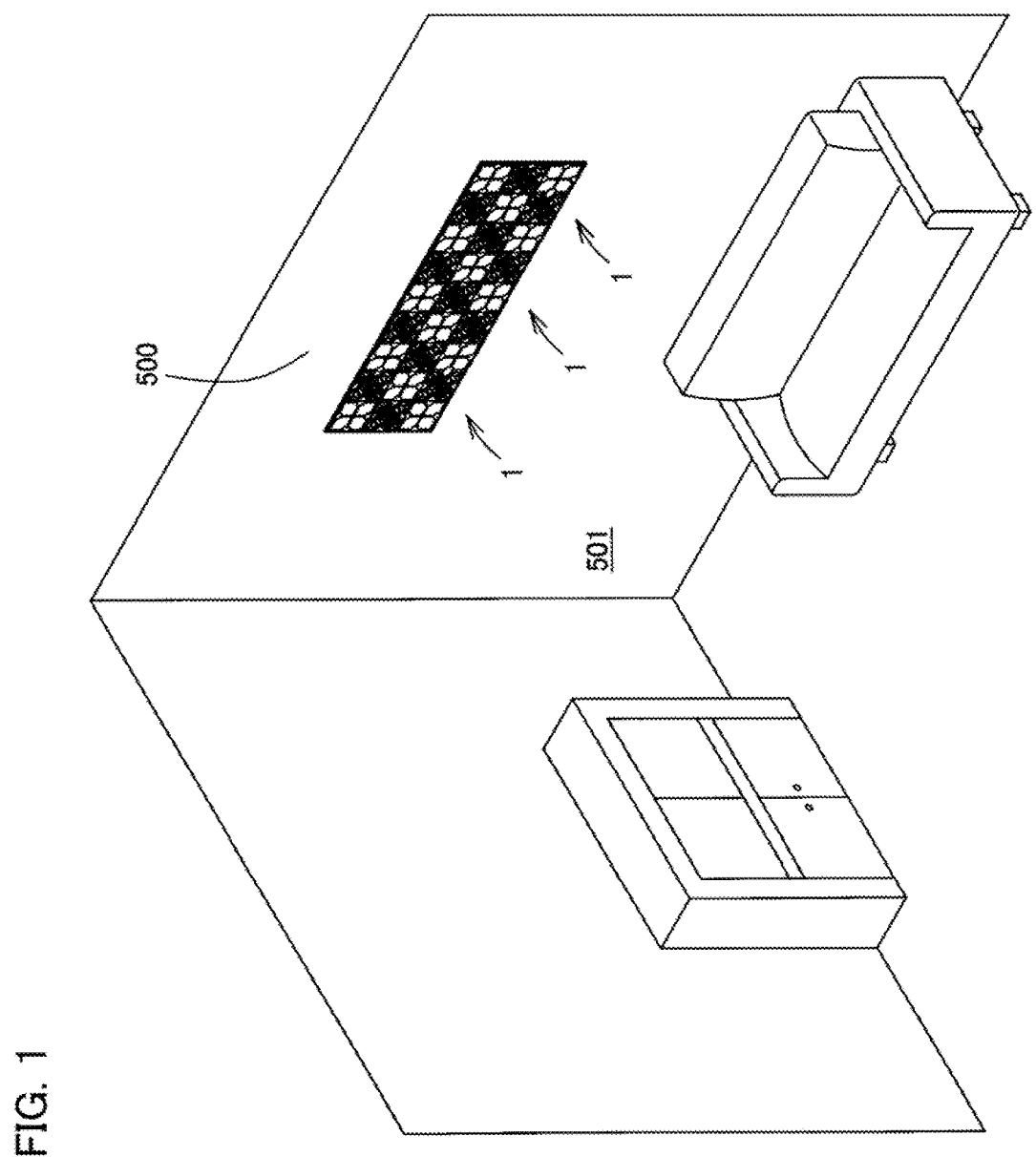
FIG. 1 is a perspective view schematically illustrating a use state of an illumination apparatus according to a first embodiment of the present invention.

As illustrated in FIG. 1, an illumination apparatus 1 according to a first embodiment of the present invention is mounted to a mounting surface 500 which is a surface of a wall, a ceiling, a floor, or the like, and illuminates a living space 501 side. The illumination apparatus 1 is arranged side by side with other plural illumination apparatuses 1 to constitute one illumination system.

Figure 2:
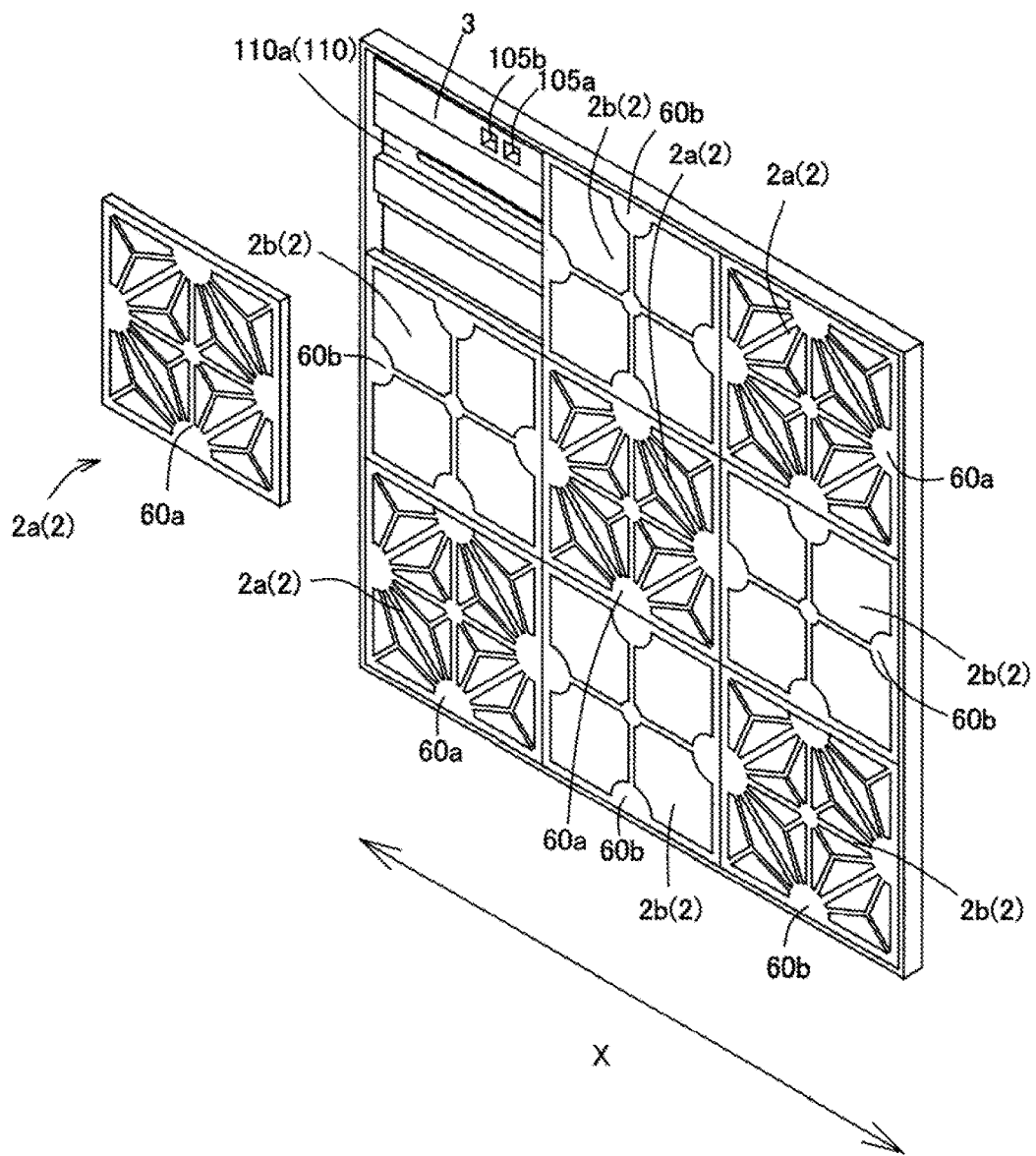
FIG. 2 is an exploded perspective view of the illumination apparatus illustrated in FIG. 1.

As illustrated in FIG. 2, the illumination apparatus 1 includes one or more types of planar light sources 2 and a mounting member 3.

Here, in the following description, in order to facilitate understanding, a case will be described where the illumination apparatus 1 is configured by combining two types of planar light sources 2 (2a, 2b) including pattern forming sections 60 (60a, 60b) having different shapes.

Figure 3:
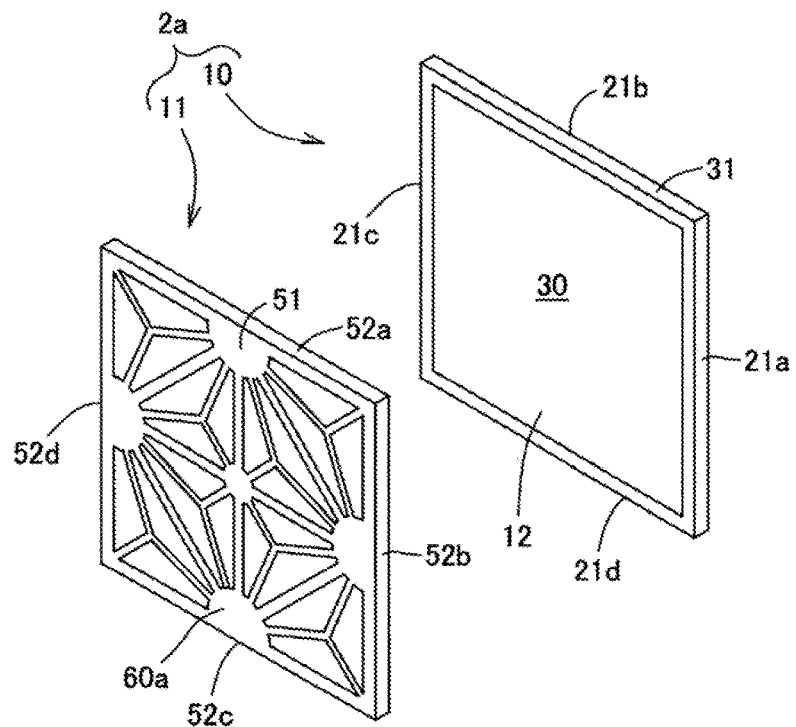
FIG. 3 is an exploded perspective view of a planar light source illustrated in FIG. 2.

As illustrated in FIG. 3, the planar light source 2a includes a planar light emitting panel 10 and a decorative member 11.

Figure 6A:
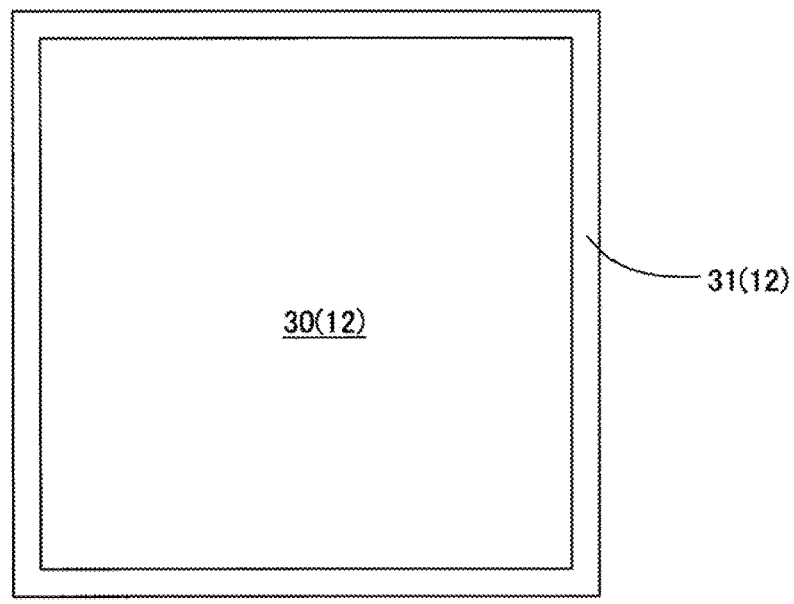
Figure 6B:
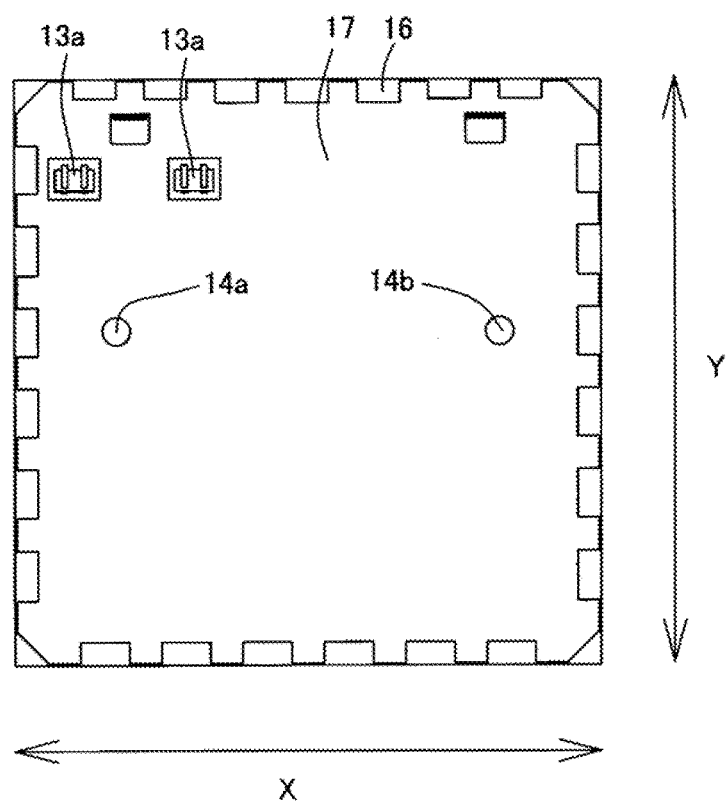

The planar light emitting panel 10 is a light emitting panel which spreads in a planar shape and can emit planar light. Specifically, the planar light emitting panel 10 is an organic EL panel and can emit diffused light. As illustrated in FIGS. 6A and 6B, the planar light emitting panel 10 includes a light emitting surface 12 on one main surface side and power supply sections 13a, 13b on the other main surface side.

As illustrated in FIG. 6A, on the light emitting surface 12, there are a light emitting region 30 that actually emits light when the planar light source is turned on, and a non-light-emitting frame region 31 surrounding the light emitting region 30.

The light emitting region 30 is a region which actually emits and radiates light when the planar light source is turned on.

When viewed from the front, the light emitting region 30 is an overlapping section of an anode layer built in the planar light emitting panel 10, an organic functional layer including an organic light emitting layer, and a cathode layer. The light emitting region 30 is a section corresponding to an organic EL device in which an anode layer, an organic functional layer, and a cathode Layer are laminated in this order. That is, in a case where the planar light source is turned on, in the light emitting region 30, a voltage is applied to the anode layer and the cathode layer, and therefore the organic light emitting layer emits and radiates light.

In addition, the color of the anode layer or the cathode layer is reflected on the light emitting region 30 and the light emitting region 30 becomes a mirror surface when the planar light source is turned off.

In the planar light emitting panel 10 according to the present embodiment, a transparent conductive oxide layer which is a transparent conductive layer is adopted as the anode layer, and a metal layer or a metal alloy layer having metallic luster is adopted as the cathode layer. That is, the color of the cathode layer is reflected on the light emitting region 30 according to the present embodiment and the light emitting region 30 becomes a mirror surface when the planar light source is turned off.

The light emitting region 30 has a rectangular shape when viewed from the front and is provided at the center of the light emitting surface 12. In the present embodiment, the light emitting region 30 is a square region.

A frame region 31 is a continuous non-light-emitting region extending along the edge of the planar light emitting panel 10 and surrounding the light emitting region 30. That is, the frame region 31 is located outside the light emitting region 30, and has a rectangular annular shape.

Figure 7:
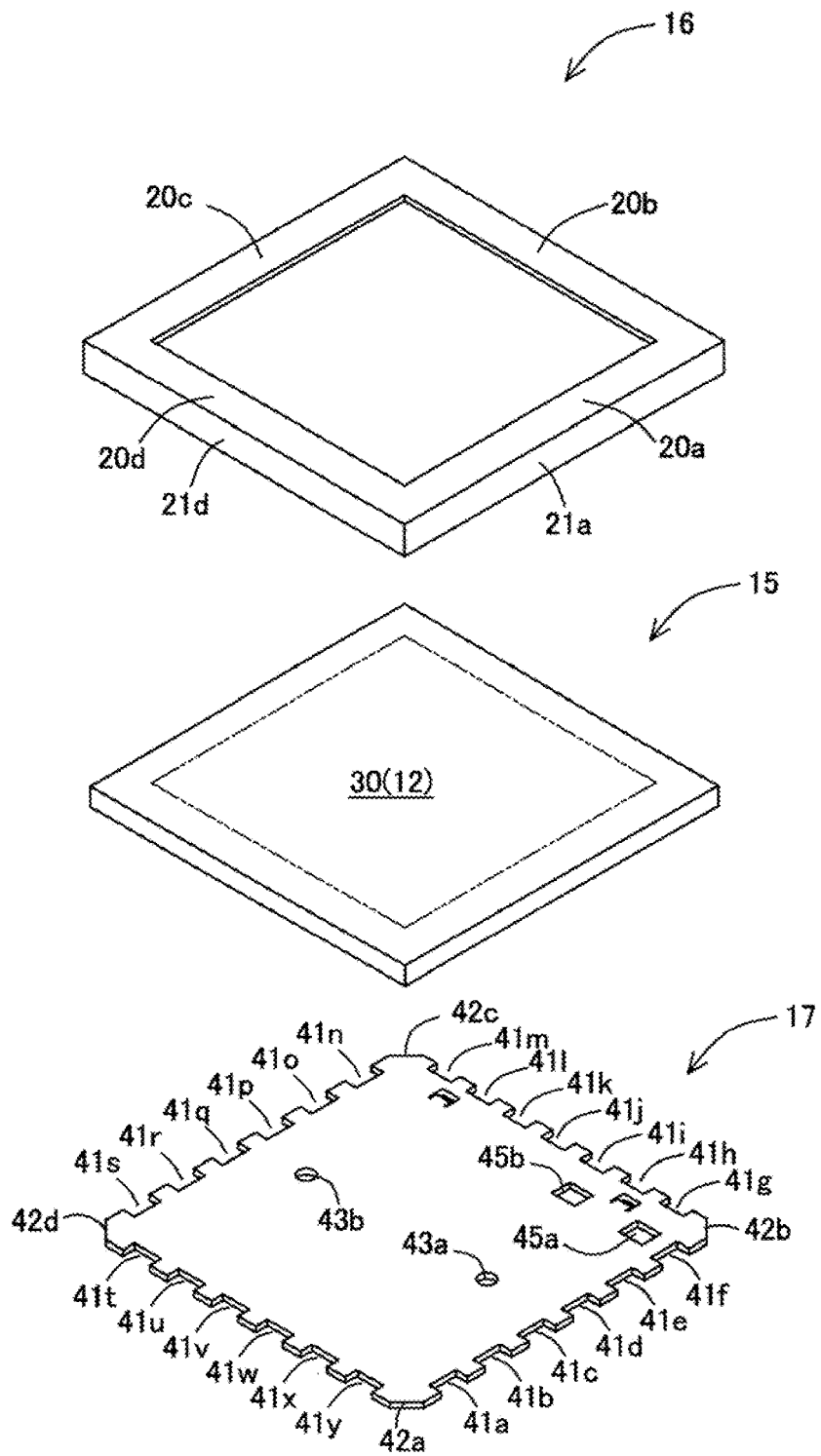
FIG. 7 is an exploded perspective view of the planar light emitting panel illustrated in FIG. 3.

As illustrated in FIG. 7, the planar light emitting panel 10 includes a planar light emitting tile 15, a frame member 16, and a reinforcing plate 17.

The planar light emitting tile 15 is a rectangular plate-shaped tile and is a thin plate-shaped tile. The planar light emitting tile 15 of the present embodiment is an organic EL tile in which a thin glass substrate is used as a supporting substrate and the above-described organic EL device is laminated on the thin glass substrate.

Figure 8:
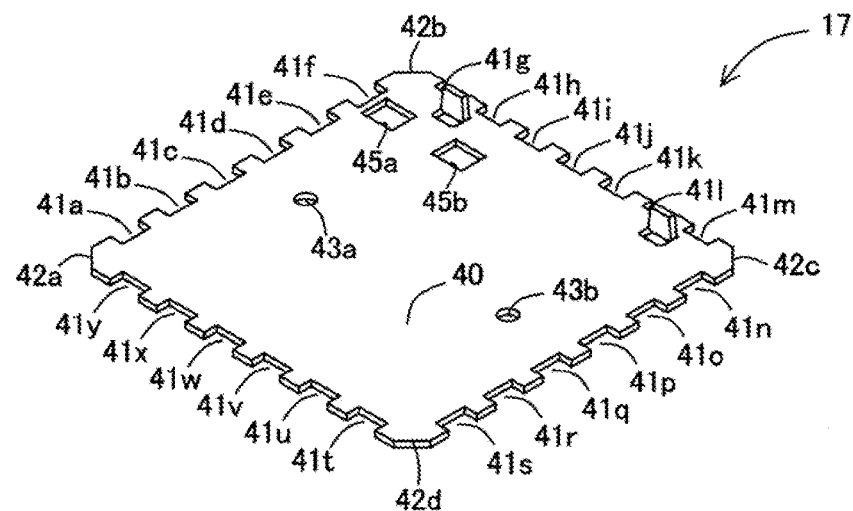
FIG. 8 is an exploded perspective view of the planar light emitting panel illustrated in FIG. 7 seen from the back.
Figure 8:
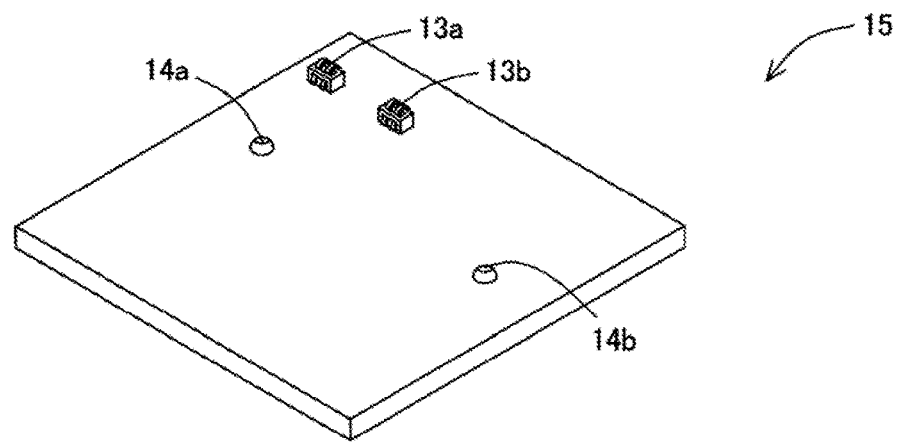
Figure 8:
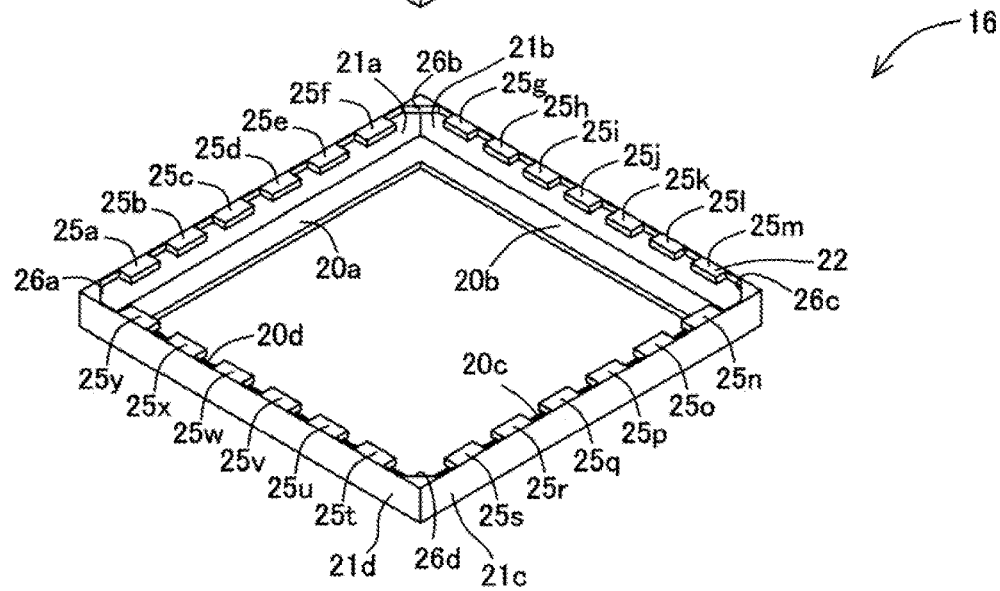

As illustrated in FIG. 8, the planar light emitting tile 15 includes the power supply sections 13a, 13b and position adjusting sections 14a, 14b on the back surface.

The power supply sections 13a, 13b are terminals electrically connected to the anode layer and the cathode layer of the organic EL device, respectively, and are terminal sections protruding from the back surface of the planar light emitting tile 15.

The position adjusting sections 14a, 14b are sections for adjusting the position of the planar light emitting tile 15 with respect to the reinforcing plate 17, and also are sections for adjusting the position of the planar light source 2a with respect to the mounting member 3. Specifically, the position adjusting sections 14a, 14b are projecting sections that projecting from the back surface of the planar light emitting tile 15.

The frame member 16 is a protective frame for protecting the end surfaces of the planar light emitting tile 15, and is an elastic member made of resin. The frame member 16 is a frame having a rectangular annular shape when viewed from the front. As illustrated in FIGS. 7 and 8, the frame member 16 includes light-emitting-side covering sections 20a to 20d, end-surface-side covering sections 21a to 21d, and a back-surface-side covering section 22.

The light-emitting-side covering sections 20a to 20d are sections covering a light emitting surface 12 side of the planar light emitting tile 15, and are sections belonging to the frame region 31 of the planar light emitting panel 10.

The end-surface-side covering sections 21a to 21d are connecting wall sections that connect the end sections of the light-emitting-side covering sections 20a to 20d and the end section of the back-surface-side covering section 22, and are sections covering the end surfaces of the planar light emitting tile 15.

As illustrated in FIG. 8, the back-surface-side covering section 22 is a section that covers the back surface side of the planar light emitting tile 15. The back-surface-side covering section 22 includes a plurality of side projecting sections 25a to 25y and four corner engaging sections 26a to 26d.

The side projecting sections 25a to 25y are sections bent from the end-surface-side covering sections 21a to 21d.

The side projecting sections 25a to 25y are projecting pieces that project from the end-surface-side covering sections 21a to 21d toward the center when viewed from the back, and are fitting sections which can be fitted to side recessed sections 41a to 41y of the reinforcing plate 17.

The side projecting sections 25a to 25y are arranged at intervals along each side of the planar light emitting panel 10. In the present embodiment, the side projecting sections 25, 25 belonging to an identical side are arranged at equal intervals.

The corner engaging sections 26a to 26d are engaging sections that are provided at the corner sections of the back-surface-side covering section 22 and can engage with corner engaging sections 42a to 42d of the reinforcing plate 17, respectively. Each of the corner engaging sections 26a to 26d has a right triangle shape.

The reinforcing plate 17 is a plate-shaped section covering the back surface side of the planar light emitting panel 10, and is a ferromagnetic section made of a ferromagnetic material. Specifically, the reinforcing plate 17 is an iron plate which is a ferromagnetic material.

As illustrated in FIG. 8, the reinforcing plate 17 includes a main body section 40, the side recessed sections 41a to 41y, and the corner engaging sections 42a to 42d.

The main body section 40 is a rectangular section in front view, and includes position adjusting holes 43a, 43b and power-supply insertion holes 45a, 45b.

The position adjusting holes 43a, 43b form a pair with the position adjusting sections 14a, 14b, respectively, and are sections for adjusting the position of the reinforcing plate 17 with respect to the planar light emitting tile 15. Specifically, the position adjusting holes 43a, 43b are insertion holes through which the position adjusting sections 14a, 14b can be inserted, respectively, and are through holes penetrating the main body section 40 in the thickness direction of the main body section 40.

The power-supply insertion holes 45a, 45b are through holes through which the power supply sections 13a, 13b of the planar light emitting tiles 15 can be inserted, and are through holes penetrating the main body section 40 in the thickness direction.

As can be seen from FIG. 8, the side recessed sections 41a to 41y are cutout sections extending inward from the edge of the main body section 40 when viewed from the back, and are fitting sections which can be fitted to the side projecting sections 25a to 25y of the frame member 16.

The side recessed sections 41a to 41y are arranged at intervals along each side of the planar light emitting panel 10. In the present embodiment, the side recessed sections 41, 41 belonging to an identical side are arranged at equal intervals.

The corner engaging sections 42a to 42d are engaging sections that are provided at the corner sections of the main body section 40 and can engage with the corner engaging sections 26a to 26d of the frame member 16, respectively. Each of the corner engaging sections 42a to 42d has a right triangle shape.

The decorative member 11 is a member having specular gloss when viewed from the front. In the decorative member 11 of the present embodiment, at least the front surface is formed of a metal or a metal alloy and has a metallic luster.

As can be seen from FIG. 3, the decorative member 11 includes a main body plate section 51, and side-surface plate sections 52a to 52d bent from the end section of the main body plate section 51.

Figure 9:
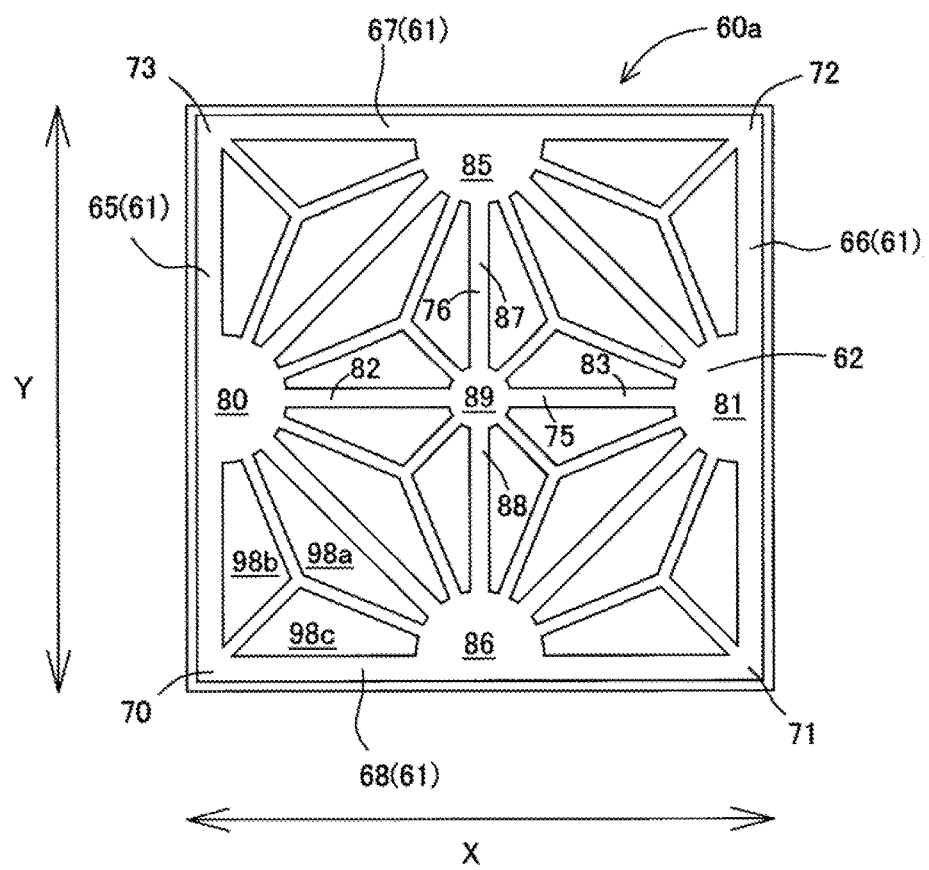
FIG. 9 is a front view of a decorative member illustrated in FIG. 3.

The main body plate section 51 is a decorative plate for covering the light emitting surface 12 side of the planar light emitting panel 10. As illustrated in FIG. 9, the main body plate section 51 includes a pattern forming section 60a forming a specific pattern.

As illustrated in FIG. 9, the pattern forming section 60a is a section which is a muntin and has the kakuasa pattern (pattern of a hemp leaf surrounded by a square) in front view. The pattern forming section 60a includes a frame shielding section 61 covering the frame region 31, and a light-emission shielding section 62 covering part of the light emitting region 30.

The frame shielding section 61 is a section overlapping with the entire area of the frame region 31 when viewed from the front, and is a section shielding light from the planar light emitting panel 10 side. That is, the frame shielding section 61 is composed of longitudinally extending sections 65, 66 and laterally extending sections 67, 68, and ends of the sections are connected to each other. The longitudinally extending sections 65, 66 and the laterally extending sections 67, 68 are continuous in a rectangular annular shape.

In other words, the frame shielding section 61 includes frame intersections 70 to 73 where the longitudinally extending sections 65, 66 and the laterally extending sections 67, 68 intersect.

The frame intersections 70 to 73 are corner intersections constituting corner sections of the pattern forming section 60a, and are formed at four corners, respectively.

The light-emission shielding section 62 includes a lateral shielding section 75 horizontally crossing the light emitting region 30 of the planar light emitting panel 10, and a longitudinal shielding section 76 vertically crossing the light emitting region 30 of the planar light emitting panel 10 when viewed from the front.

As illustrated in FIG. 9, the lateral shielding section 75 includes planar shielding sections 80, 81, connecting shielding sections 82, 83, and a central intersection 89.

The planar shielding sections 80, 81 are provided in the middle sections of the longitudinally extending sections 65, 66 and are semicircular sections extending from the longitudinally extending sections 65, 66 toward the central intersection 89. That is, each of the planar shielding sections 80, 81 has a curved end when viewed from the front. The planar shielding sections 80, 81 of the present embodiment are provided at the center in the extending direction of the longitudinally extending sections 65, 66.

The "middle section" here means an intermediate section in the extending direction and refers to a section other than an end section. The same shall apply hereinafter.

The connecting shielding section 82 is a section connecting the planar shielding section 80 and the central intersection 89, and the connecting shielding section 83 is a section connecting the central intersection 89 and the planar shielding section 80. The connecting shielding sections 82, 83 extend linearly in a lateral direction X.

As illustrated in FIG. 9, the longitudinal shielding section 76 includes planar shielding sections 85, 86, connecting shielding sections 87, 88, and the central intersection 89.

The planar shielding sections 85, 86 are provided in the middle sections of the laterally extending sections 67, 68 and are semicircular sections extending from the laterally extending sections 67, 68 toward the central intersection 89. The planar shielding sections 85, 86 of the present embodiment are provided at the center of the laterally extending sections 67, 68.

The connecting shielding section 87 is a section connecting the planar shielding section 85 and the central intersection 89, and the connecting shielding section 88 is a section connecting the central intersection 89 and the planar shielding section 86. The connecting shielding sections 87, 88 extend linearly in a longitudinal direction Y.

The central intersection 89 is a section located at the center of the light-emission shielding section 62 and is a section where the lateral shielding section 75 and the longitudinal shielding section 76 intersect. That is, the central intersection 89 is a section where the connecting shielding sections 82, 83, 87, 88 merge.

Figure 10A:
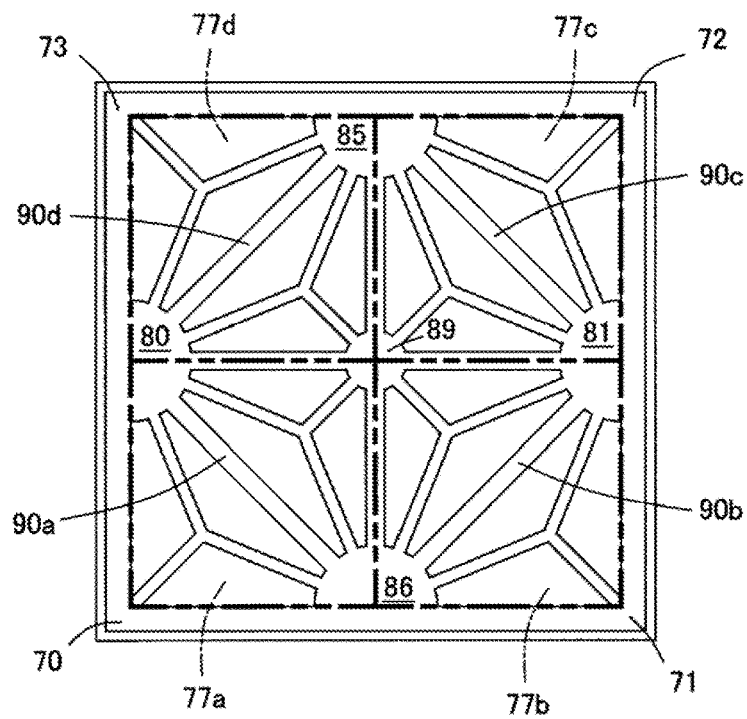

As illustrated in FIG. 10A, the light-emission shielding section 62 is divided into four first regions 77a to 77d by the lateral shielding section 75 and the longitudinal shielding section 76.

Each of the first regions 77a to 77d is a rectangular region, and specifically has a square shape.

The first regions 77a, 77b are in line symmetry with the first regions 77d, 77c with the lateral shielding section 75 as the axis of symmetry, and the first regions 77a, 77d are in line symmetry with the first regions 77b, 77c with the longitudinal shielding section 76 as the axis of symmetry.

That is, the light-emission shielding section 62 is 4-fold rotational symmetrical with the central intersection 89 as the rotation axis when viewed from the front.

Figure 10B:
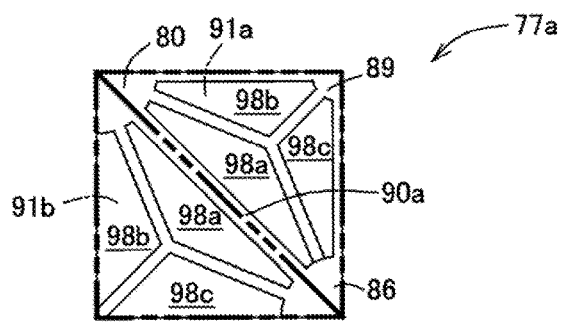

As can be seen from FIG. 10B, in the first regions 77a (77b to 77d), second connecting shielding sections 90a to 90d (shielding extending sections) are provided, and the first regions 77a to 77d are divided into two second regions 91a, 91b by the second connecting shielding sections 90a (90b to 90d), respectively.

The second connecting shielding sections 90a to 90d are sections connecting the planar shielding sections 80, 81, 85, 86 and are sections connecting the planar shielding sections 80, 81, 85, 86 linearly in an oblique direction. That is, each of the second connecting shielding sections 90a to 90d has a lateral X component and a longitudinal Y component when viewed from the front.

Both of the second regions 91a, 91b are right triangular regions, and are in line symmetry with respect to the second connecting shielding section 90a (90b to 90d) as the axis of symmetry.

Figure 10C:
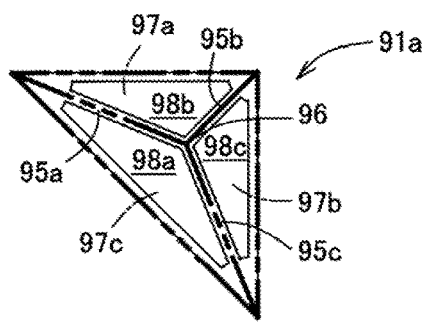

As illustrated in FIG. 10C, third connecting shielding sections 95a to 95c (shielding extending sections) extending from respective apexes toward the center are provided in each of the second regions 91a, 91b. The third connecting shielding sections 95a to 95c intersect at one intersection 96.

Each of the second regions 91a, 91b is divided into three third regions 97a, 97b, 97c by the third connecting shielding sections 95a to 95c which each extend so as to be a bisector of each corner.

Each of the third regions 97a, 97b, 97c is a triangular region.

The third regions 97a, 97b, 97c are provided with a plurality of types of light transmitting holes 98a, 98b, 98c, respectively.

The light transmitting holes 98a, 98b, 98c are holes through which light from the light emitting region 30 of the planar light emitting panel 10 can pass, and are through holes penetrating in the thickness direction of the main body plate section 51. Each of the light transmitting holes 98a, 98b, 98c has a triangular shape.

Here, the positional relationship of each section of the planar light source 2 of the present embodiment will be described.

Figure 5A:
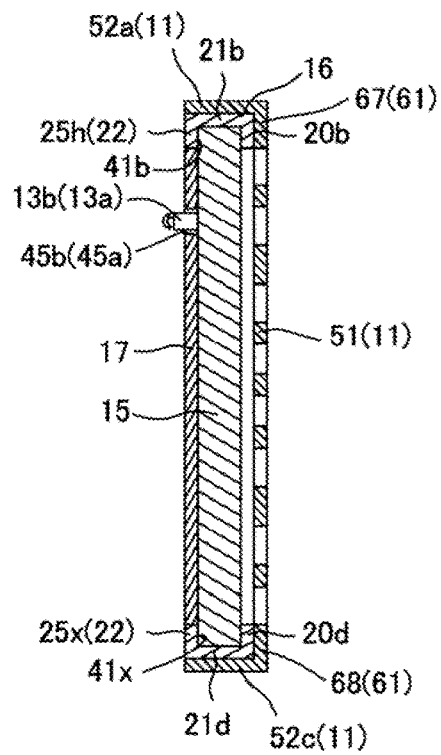
Figure 5B:
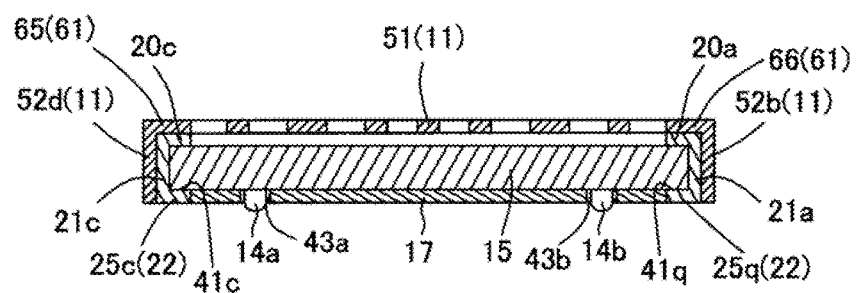

As illustrated in FIGS. 5A and 5B, in the planar light emitting panel 10, the reinforcing plate 17 covers the back surface of the planar light emitting tile 15, and part of the power supply sections 13a, 13b passes through the power-supply insertion holes 45a, 45b and is exposed.

Part of the front surface side of the planar light emitting tile 15 is covered with the light-emitting-side covering sections 20a to 20d of the frame member 16. The end surfaces of the planar light emitting tile 15 are covered with the end-surface-side covering sections 21a to 21d of the frame member 16.

Part of the back surface side of the planar light emitting tile 15 is covered with the back-surface-side covering section 22 of the frame member 16, and the remaining part is covered with the reinforcing plate 17.

Figure 4:
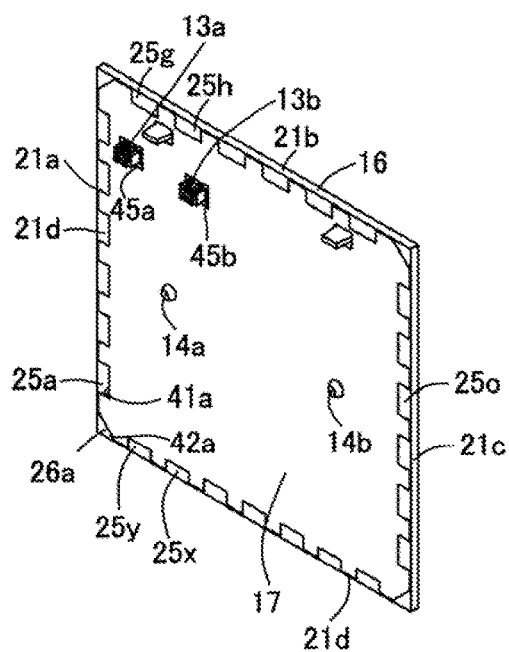
FIG. 4 is a perspective view of the planar light source illustrated in FIG. 2 as viewed from another direction.

As can be seen from FIGS. 4 and 8, in the frame member 16, the side projecting sections 25a to 25y are inserted and fitted into the side recessed sections 41a to 41y of the reinforcing plate 17, and the corner engaging sections 26a to 26d are engaged with the corner engaging sections 42a to 42d of the reinforcing plate 17.

In the decorative member 11, as illustrated in FIG. 3, the pattern forming section 60a of the main body plate section 51 covers the front surface side of the planar light emitting panel 10. Specifically, as can be seen from FIGS. 5A and 5B, in the pattern forming section 60a, the extending sections 65 to 68 of the frame shielding section 61 cover the light-emitting-side covering sections 20a to 20d of the frame member 16, and the light-emission shielding section 62 covers the light emitting section of the planar light emitting tile 15 when the planar light source is turned on. In other words, in the pattern forming section 60a, the frame shielding section 61 covers the frame region 31 of the planar light emitting panel 10, and the light-emission shielding section 62 covers the light emitting region 30 of the planar light emitting panel 10.

In the decorative member 11, as can be seen from FIGS. 5A and 5B, the side-surface plate section 52 covers the end surface of the planar light emitting panel 10. That is, the end-surface-side covering sections 21a to 21d of the frame member 16 are interposed between the side-surface plate sections 52a to 52d of the decorative member 11 and the end surface of the planar light emitting tile 15. In other words, the end-surface-side covering sections 21a to 21d of the frame member 16 are sandwiched between the side-surface plate sections 52a to 52d of the decorative member 11 and the end surfaces of the planar light emitting tile 15, respectively.

Subsequently, the planar light source 2b will be described. Since the planar light source 2b is identical to the planar light source 2a except for the shape of the pattern forming section 60, overlapping description will be omitted. In a pattern forming section 60b, identical reference signs are given to configurations identical to those of the pattern forming section 60a, and the description thereof will be omitted.

Figure 11A:
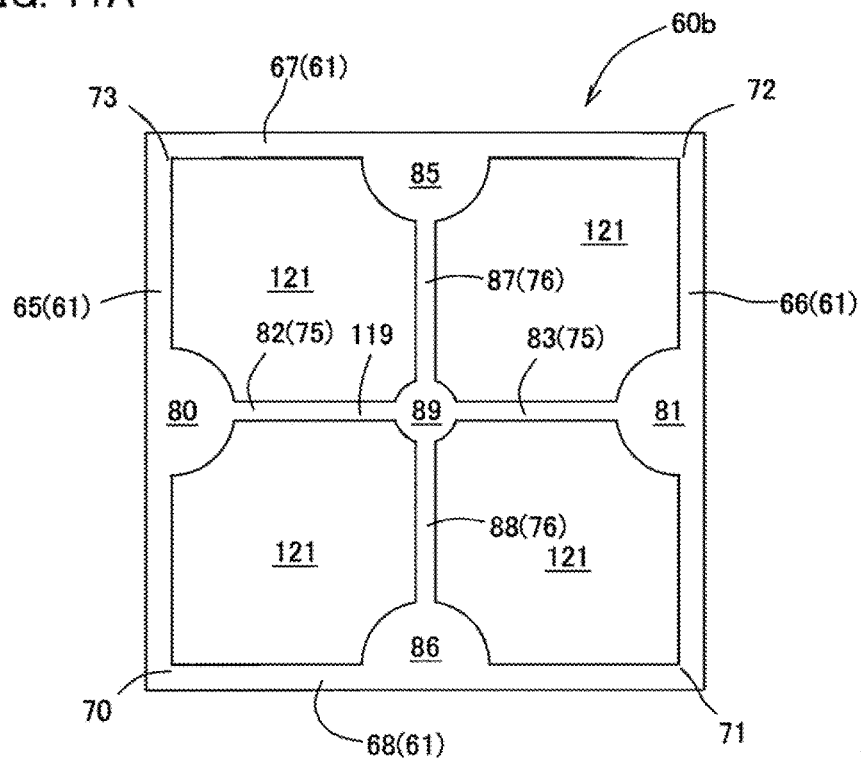

As illustrated in FIG. 11A, the pattern forming section 60b of the planar light source 2b includes a frame shielding section 61 covering a frame region 31 and a light-emission shielding section 119 covering part of the light emitting region 30.

Figure 11B:
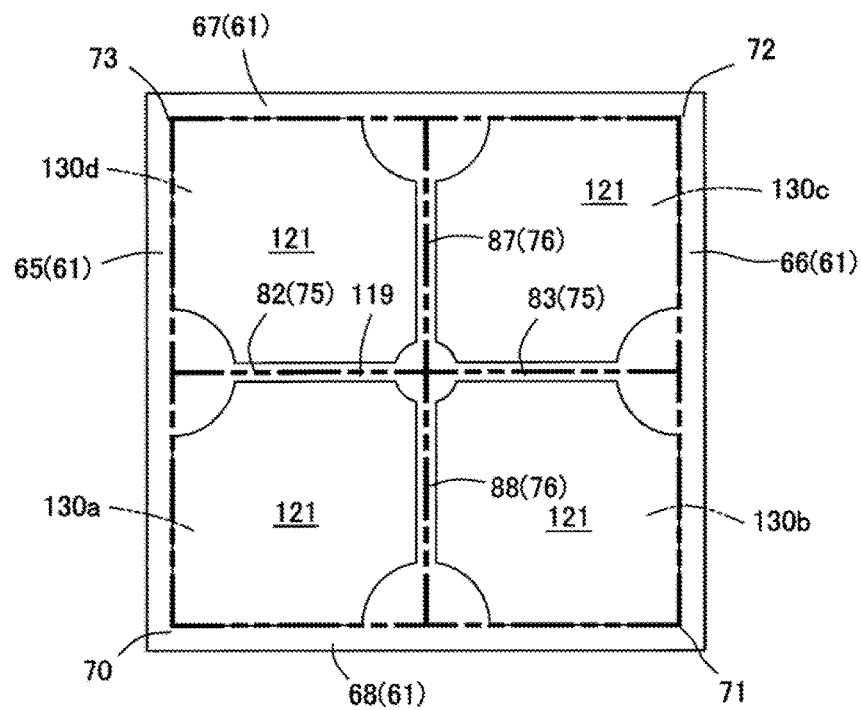

The light-emission shielding section 119 of the pattern forming section 60b includes a lateral shielding section 75 horizontally crossing the light emitting region 30 of a planar light emitting panel 10, and a longitudinal shielding section 76 vertically crossing the light emitting region 30 of the planar light emitting panel 10. As illustrated in FIG. 11B, the light-emission shielding section 62 is divided into four first regions 130a to 130d by the lateral shielding section 75 and the longitudinal shielding section 76.

Unlike the first regions 77a to 77d, the first regions 130a to 130d are not provided with second connecting shielding sections 90a to 90d or the like. That is, unlike the light-emission shielding section 62 of the pattern forming section 60a, only the lateral shielding section 75 and the longitudinal shielding section 76 are provided in the light-emission shielding section 119 of the pattern forming section 60b.

In addition, four rectangular light transmitting holes 121 are provided in the first regions 130a to 130d.

Here, as described above, there are the two kinds of pattern forming sections 60 (60a, 60b) in the planar light sources 2 constituting the illumination apparatus 1.

The shielding rate of each of the light-emission shielding sections 62, 119 of the pattern forming sections 60a, 60b is preferably 5% to 75% inclusive. That is, it is preferable that the light-emission shielding sections 62, 119 of the pattern forming sections 60a, 60b overlap in a range from 5% to 75% inclusive with the light emitting region 30 of the planar light emitting panel 10 when viewed from the front.

Within the above range, the light-emission shielding section 62 has a certain amount of area. Therefore, it is possible to prevent trouble caused by an increase in temperature of the planar light emitting panel 10 due to light-induced heat accumulated between the decorative member 11 and the planar light emitting panel 10 while sufficient mechanical strength is ensured.

Note that the term "shielding rate" as used herein refers to the light shielding rate against the total area of the light emitting region. That is, the shielding rate of the pattern forming section 60 represents the rate of area where the pattern forming section 60 covers the light emitting region 30 of the planar light emitting panel 10 against the total area of the light emitting region 30 of the planar light emitting panel 10 when viewed from the front.

In addition, the shielding rate of the light-emission shielding section 119 of the pattern forming section 60b is smaller than the shielding rate of the light-emission shielding section 62 of the pattern forming section 60a.

The difference between the shielding rate of the light-emission shielding section 62 of the pattern forming section 60a and the shielding rate of the light-emission shielding section 119 of the pattern forming section 60b is preferably 10% to 70% inclusive, and more preferably 20% to 60% inclusive from a viewpoint of increasing the difference in light intensity in the illumination apparatus 1.

The mounting member 3 is a member that can be fixed to the mounting surface 500 such as a wall and is a member that mounts the plurality of planar light sources 2a to the mounting surface 500.

Figure 12:
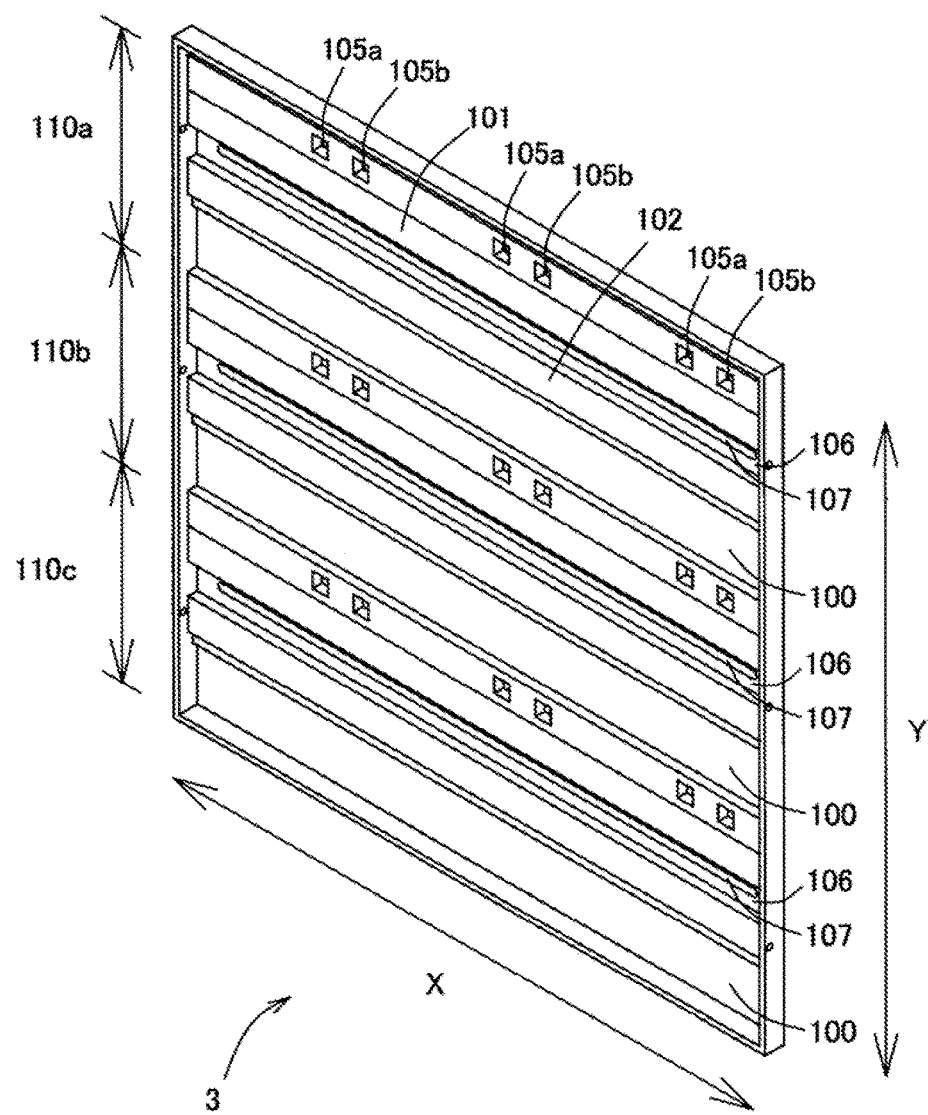
FIG. 12 is a perspective view of a mounting member illustrated in FIG. 3.

As illustrated in FIG. 12, the mounting member 3 includes a plurality of fixing units 110a to 110c. The fixing units 110a to 110c are belt-shaped sections extending in the lateral direction X and aligned in the longitudinal direction Y. Each of the fixing units 110a to 110c include a main body wall section 100, projecting strip sections 101, 102, and a plurality of power supply sections 105a, 105b.

The main body wall section 100 is a rectangular wall section in front view, and is a long plate-like section extending in the lateral direction X.

The projecting strip sections 101, 102 are projecting sections projecting from the main body wall section 100 toward the front side, and extend in the lateral direction X. Each of the projecting strip sections 101, 102 has a width in the longitudinal direction Y, and includes a magnetic force generating section inside.

The magnetic force generating section generates magnetic force and attracts the reinforcing plate 17 of the planar light source 2.

The magnetic force generating section is composed of a permanent magnet.

The projecting strip sections 101, 102 are arranged at an interval in the longitudinal direction, and form a recessed groove 106 together with the main body wall section 100.

The recessed groove 106 is a section that is sandwiched by the projecting strip sections 101, 102 when viewed from the front, and is a section recessed with respect to the projecting strip sections 101, 102.

The recessed groove 106 is a bottomed groove into which the position adjusting sections 14a, 14b of the planar light source 2a can be inserted, and is a section that regulates the moving direction and the posture of the position adjusting sections 14a, 14b.

As illustrated in FIG. 12, the recessed groove 106 has a mounting hole 107 at a bottom section.

The mounting hole 107 is a hole into which a fastening element 505 is inserted in order to mount the mounting member 3 to the mounting surface 500. The mounting hole 107 is a through hole penetrating the main body wall section 100 constituting the bottom section of the recessed groove 106 in the thickness direction and is an elongated hole extending in the lateral direction X.

The term "fastening element" as used herein is a generic concept of a screw, a nail, a rivet, and the like, and is a concept including a temporary fastening element. The same shall apply hereinafter.

The fastening element 505 of the present embodiment is a temporary fastening element, specifically, a screw having a head section and a shaft section.

The power supply sections 105a, 105b are electrically connected to an external power source or other adjacent power supply sections 105a, 105b, and supply power to the planar light source 2a. The power supply sections 105a, 105b can supply power to the planar light source 2a by contacting the power supply sections 13a, 13b of the planar light source 2a.

Subsequently, the positional relationship of each constituent of the illumination apparatus 1 of the present embodiment will be described.

Figure 13:
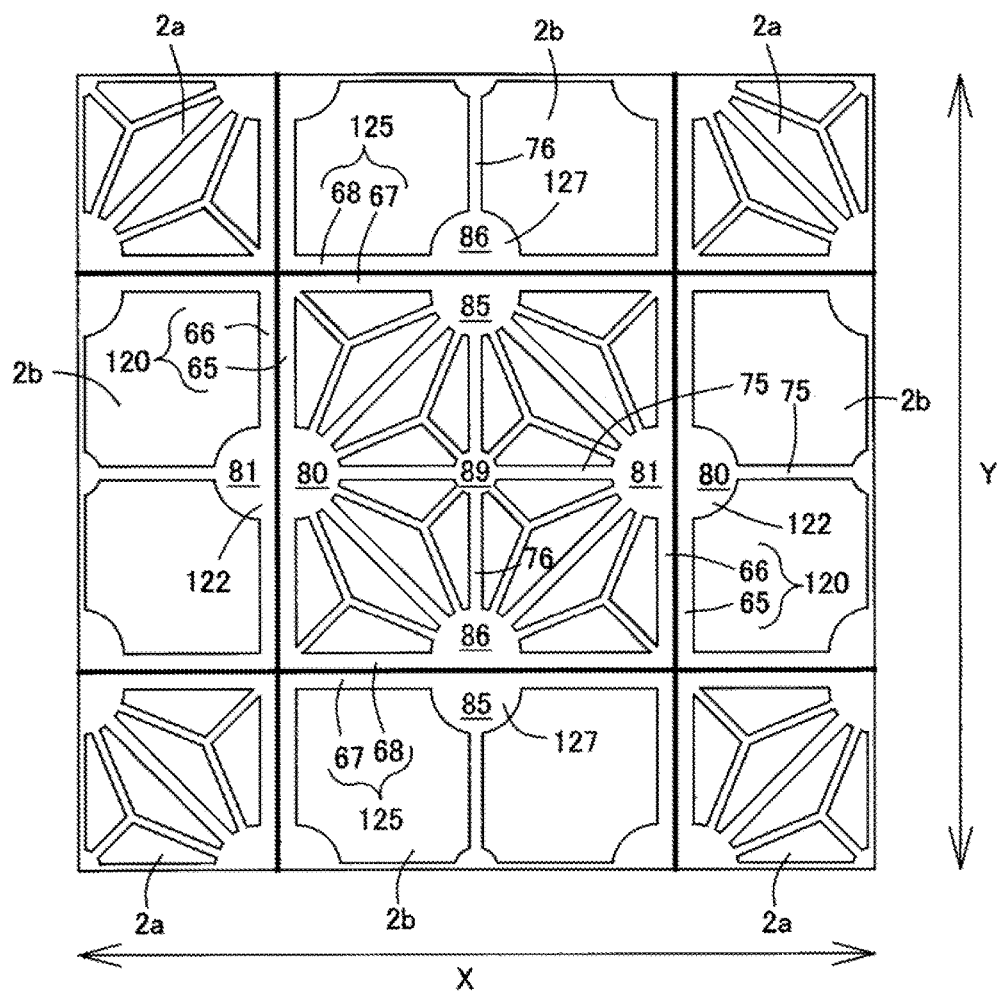
FIG. 13 is a front view of main parts of the illumination apparatus illustrated in FIG. 1.

As illustrated in FIG. 13, the illumination apparatus 1 includes the plurality of types of planar light sources 2a, 2b mixedly arranged side by side in a lattice pattern in the longitudinal and lateral directions by the mounting member 3. In the illumination apparatus 1, the planar light source 2a and the planar light source 2b are alternately arranged vertically and horizontally by the mounting member 3.

Specifically, in the illumination apparatus 1, the reinforcing plate 17 of each planar light source 2 is attracted by the magnetic force generating section of the mounting member 3, and the planar light sources 2 are fixed to the fixing units 110a to 110c of respective stages. That is, in the illumination apparatus 1, the planar light source 2a, the planar light source 2b, and the planar light source 2a are arranged side by side in the lateral direction X in this order by the fixing unit 110a on a first stage, the planar light source 2b, the planar light source 2a, and the planar light source 2b are arranged side by side in the lateral direction X in this order by the fixing unit 110b on a second stage, and the planar light source 2a, the planar light source 2b, and the planar light source 2a are arranged side by side in the lateral direction X in this order by the fixing unit 110c on a third stage.

The fastening element 505 such as a screw is inserted into the mounting hole 107 and the mounting member 3 is fixed to the mounting surface 500. In the recessed groove 106 of the mounting member 3, the position adjusting holes 43a, 43b of the reinforcing plate 17 constituting part of the back surface of the planar light emitting panel 10 are inserted. The power supply section 105 passes through the power-supply insertion hole 45 and is connected to the power supply section 13 of the planar light emitting tile 15.

When the planar light source 2a and the planar light source 2b adjacent in the lateral direction X are focused on, the longitudinally extending section 65 of the planar light source 2a and the longitudinally extending section 66 of the planar light source 2b overlap with each other in the lateral direction X and form a band-like pattern section 120 continuous in a band shape as illustrated in FIG. 13. The lateral shielding section 75 of the planar light source 2a and the lateral shielding section 75 of the planar light source 2b are linearly arranged in the lateral direction X and form a linear pattern section extending in a linear shape. The planar shielding section 81 of the planar light source 2a forms a circular pattern section 122 which is substantially circular together with the planar shielding section 80 of the planar light source 2b via the longitudinally extending sections 65, 66.

When the planar light source 2a and the planar light source 2b adjacent in the longitudinal direction Y are focused on, the laterally extending section 67 of the planar light source 2a and the laterally extending section 68 of the planar light source 2b overlap with each other in the longitudinal direction Y and form a band-like pattern section 125 continuous in a band shape as illustrated in FIG. 13. The longitudinal shielding section 76 of the planar light source 2a and the longitudinal shielding section 76 of the planar light source 2b are linearly arranged in the longitudinal direction Y and form a linear pattern section extending in a linear shape. The planar shielding section 85 of the planar light source 2a forms a circular pattern section 127 which is substantially circular together with the planar shielding section 86 of the planar light source 2b via the laterally extending sections 67, 68. The circular pattern sections 122, 127 are arranged at equal intervals in the longitudinal and lateral directions, and are distributed as lattice points as a whole.

Subsequently, a turned-on state and a turned-off state of the illumination apparatus 1 of the present embodiment will be described.

First, the state in which the illumination apparatus 1 is turned on will be described.

Figure 14A:
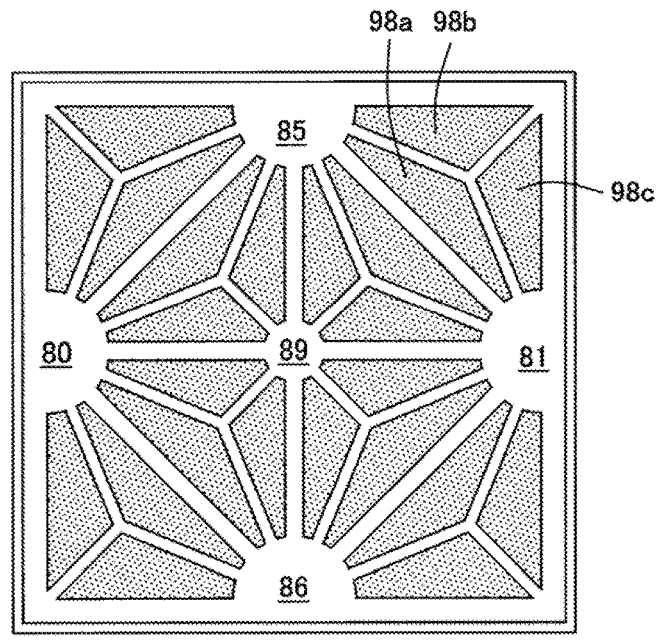

As illustrated in FIG. 14A, in the planar light sources 2a, 2b, part of irradiation light from the light emitting region 30 is shielded by the pattern forming section 60, and a pattern along the shape of the pattern forming section 60 is reflected. That is, light from the light emitting region 30 passes through the respective light transmitting holes 98a to 98c and radiates into the living space 501 side, and only the sections where the light transmitting holes 98a to 98c are formed emit light.

Figure 15A:
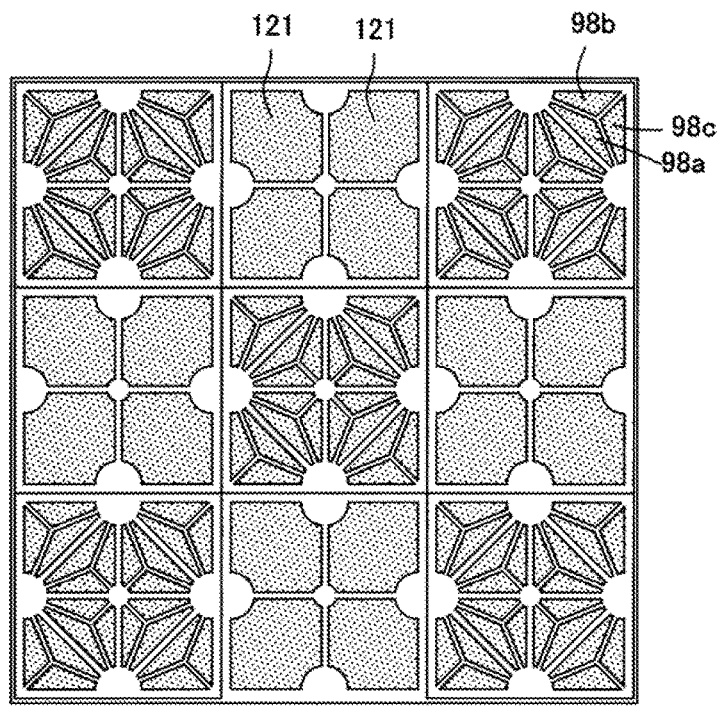

In addition, in the entire illumination apparatus 1, as described above, the light transmitting holes 98a to 98c of the planar light source 2a and the light transmitting holes 121 of the planar light source 2b have different total opening area. Therefore, the light transmitting holes 98a to 98c and the light transmitting holes 121 have different shielding rates, and have different light transmittance of light emitted from the light emitting region 30 of the planar light emitting panel 10. That is, since the shielding rate of the planar light source 2a is higher than that of the planar light source 2b, the planar light source 2a is darker than the planar light source 2b. Therefore, as illustrated in FIG. 15A, a difference in light intensity is generated between the planar light source 2a and the planar light source 2b. That is, in the illumination apparatus 1, one light gradation pattern is formed by a plurality of (in the present embodiment, nine) planar light sources 2 (2a, 2b) when viewed from a distance.

Subsequently, a state in which the illumination apparatus 1 is turned off will be described.

Figure 14B:
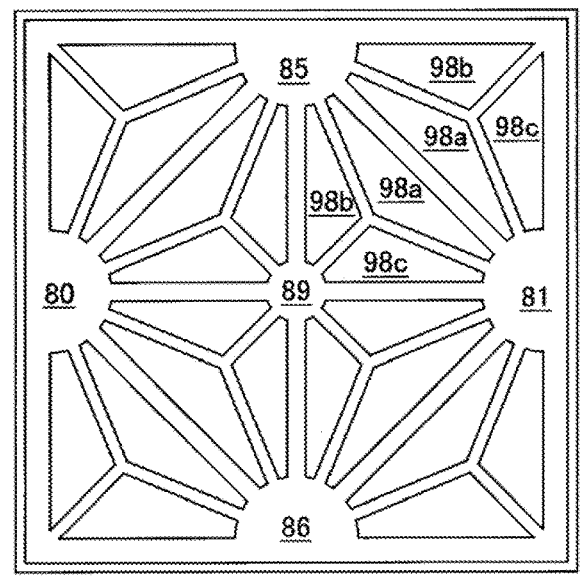

As illustrated in FIG. 14B, in the planar light emitting panel 10, the color of the cathode layer is reflected on the light emitting region 30 and thus the light emitting region 30 becomes a mirror surface, and the pattern forming section 60 of the decorative member 11 has a specular gloss. Therefore, the light emitting region 30 together with the pattern forming section 60 of the decorative member 11 constitutes one mirror surface when viewed from a distance.

Figure 15B:
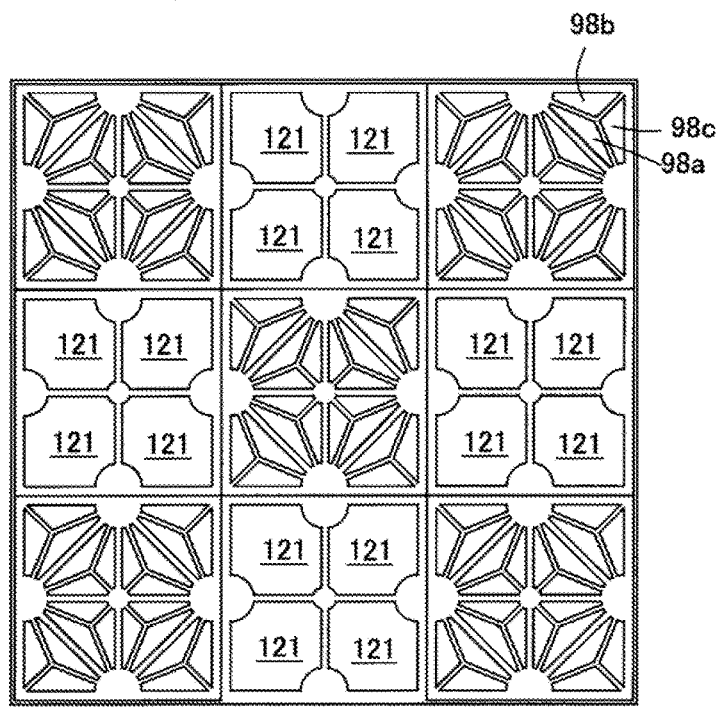

In addition, as illustrated in FIG. 15B, in the illumination apparatus 1, each of the planar light sources 2a, 2b forms a mirror surface, and the illumination apparatus 1 as a whole becomes one large mirror surface when viewed from a distance. Therefore, the living space 501 is displayed on the illumination apparatus 1, and the living space 501 can be made to look larger.

According to the planar light sources 2a, 2b of the present embodiment, the front surface of the planar light emitting panel 10 is covered with the pattern forming section 60, and the light-emission shielding section 62 is formed so as to partially shield light from the light emitting region 30. Therefore, the pattern of the pattern forming section 60 is emphasized by the light from the light emitting region 30 when the planar light sources are turned on, and the planar light sources 2a, 2b become excellent in design property.

According to the planar light sources 2a, 2b of the present embodiment, the light emitting region 30 of the planar light emitting panel 10 and the pattern forming section 60 of the decorative member 11 constitute one mirror surface when the planar light sources 2a, 2b are turned off. Therefore, the planar light sources 2a, 2b can function as a mirror.

According to the planar light sources 2a, 2b of the present embodiment, part or the whole of the light-emission shielding section 62 of the decorative member 11 is a crosspiece connecting the extending sections 65 to 68 of the frame shielding section 61, and the decorative member 11 functions as a reinforcing member of the planar light emitting panel 10. Therefore, mechanical strength of the planar light emitting panel 10 is reinforced and warping or the like of the planar light emitting panel 10 when the planar light sources 2a, 2b are turned on can be suppressed.

According to the planar light sources 2a, 2b of the present embodiment, since the light-emission shielding section 62 of the pattern forming section 60 covers the projection surface of the light emitting region 30 in the thickness direction, the light emitting region 30 is protected by the light-emission shielding section 62, and the light emitting part when the planar light sources 2a, 2b are turned on is not easily damaged.

According to the planar light sources 2a, 2b of the present embodiment, part of the elastic frame member 16 is sandwiched between the peripheral end surface of the planar light emitting tile 15 and the side-surface plate sections 52a to 52d of the decorative member 11. Therefore, it is possible to alleviate distortion due to a difference in thermal expansion coefficient between the planar light emitting tile 15 and the decorative member 11.

According to the illumination apparatus 1 of the present embodiment, since the first regions 77a to 77d and the first regions 130a to 130d of the planar light sources 2a, 2b are 4-fold rotational symmetrical, even if the planar light sources 2a, 2b are mounted to the mounting member 3 in any direction, the planar light sources 2a, 2b can emit light similarly.

According to the illumination apparatus 1 of the present embodiment, since the pattern forming sections 60 of the respective planar light sources 2 are continuous and form one pattern, it is possible to display one pattern having large area when the illumination apparatus 1 is turned on.

In addition, according to the illumination apparatus 1 of the present embodiment, a large number of the triangular light transmitting holes 98a, 98b, 98c are provided in the pattern forming section 60 of each planar light source 2, and the light transmitting holes 98a, 98b, 98c are dispersed so as to form a planar shape as a whole. Therefore, a stained glass pattern can be displayed.

According to the illumination apparatus 1 of the present embodiment, the respective planar light sources 2 are continuous to constitute one mirror surface when the illumination apparatus 1 is turned off. Therefore, the illumination apparatus 1 can be used as a mirror having large area, and the illumination apparatus 1 can make the living space 501 look greater by displaying the living space 501.

Subsequently, an illumination apparatus 200 according to a second embodiment of the present invention will be described. Note that identical reference numerals are given to configurations identical to those of the illumination apparatus 1 of the first embodiment, and the description thereof will be omitted.

Figure 16:
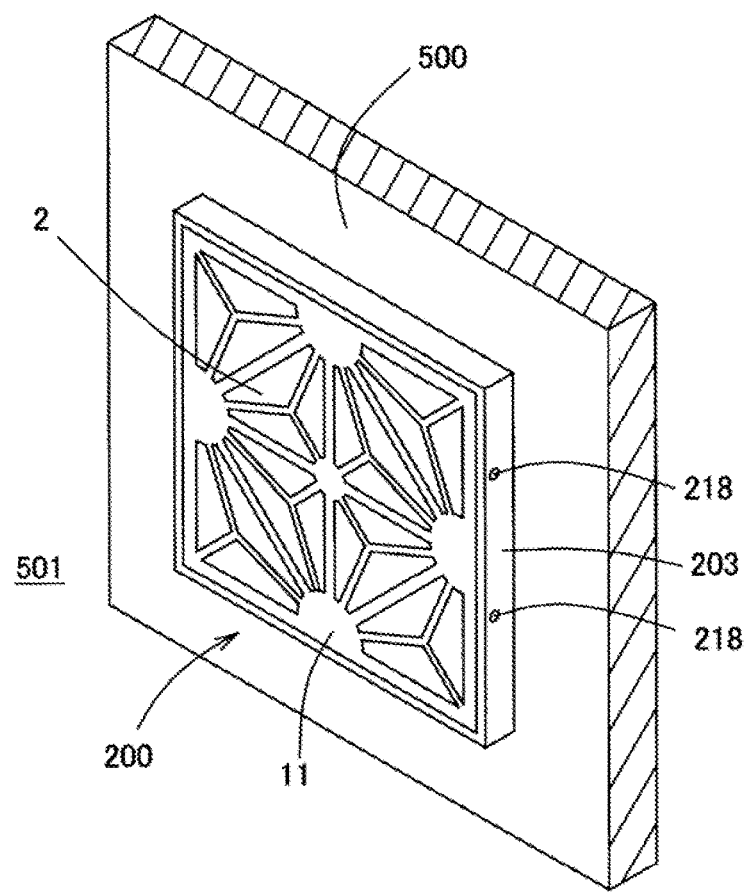
FIG. 16 is a perspective view in a case where an illumination apparatus according to a second embodiment of the present invention is installed on a mounting surface in a vertical posture.

The illumination apparatus 200 of the second embodiment differs from the illumination apparatus 1 of the first embodiment in the shape of the mounting member. As illustrated in FIG. 16, in the illumination apparatus 200, one planar light source 2 is supported by one mounting member 203. In addition, the mounting member 203 can fix the planar light source 2 in two postures.

Figure 17:
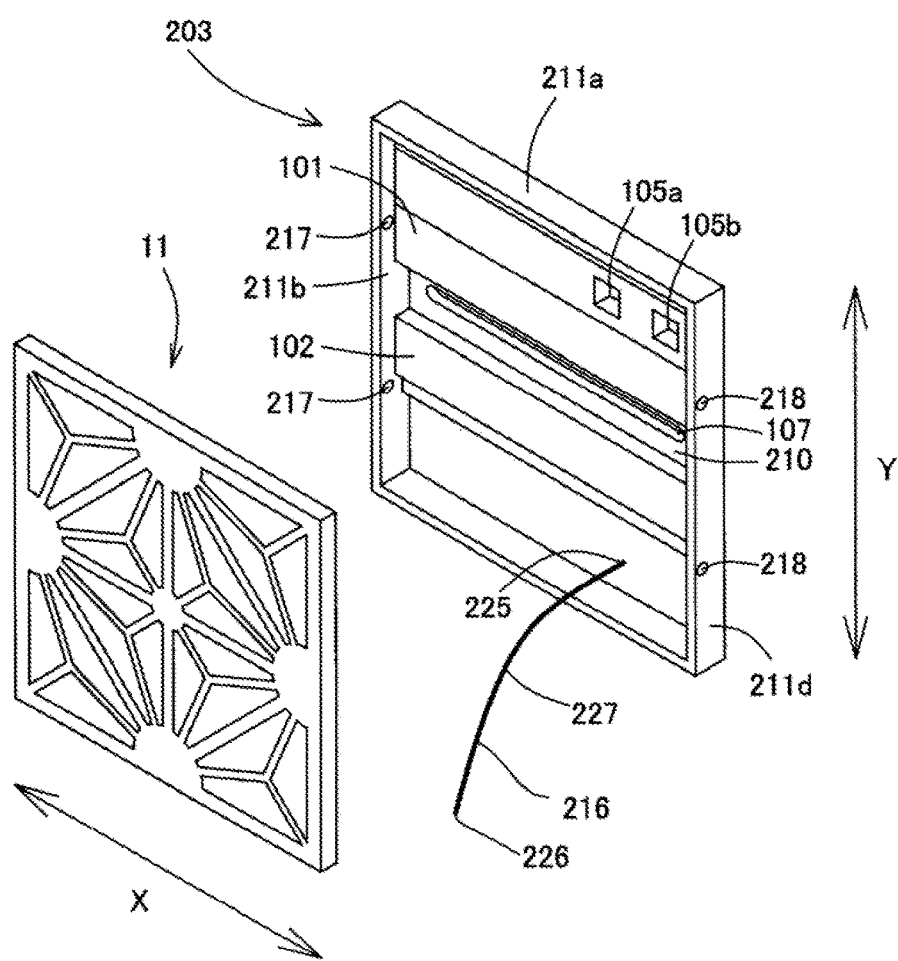
FIG. 17 is an exploded perspective view of the illumination apparatus illustrated in FIG. 16.

As illustrated in FIG. 17, the mounting member 203 includes a main body wall section 210, side-surface wall sections 211a to 211d, projecting strip sections 101, 102, power supply sections 105a, 105b, and a fall prevention member 216.

The main body wall section 210 is a section having a shape similar to that of a light emitting surface 12 of a planar light emitting panel 10 in front view. In the present embodiment, the main body wall section 210 is a square section.

The side-surface wall sections 211a to 211d are wall sections erected from respective sides of the main body wall section 210.

The side-surface wall sections 211b, 211d erected from longitudinal sides (sides extending in a longitudinal direction Y) of the main body wall section 210 have second mounting holes 217, 218, respectively.

The second mounting holes 217, 218 are insertion holes into which fastening elements 505 are inserted in order to mount the mounting member 203 in a horizontal posture with respect to a mounting surface 500. The second mounting holes 217, 218 are through holes penetrating the side-surface wall sections 211b, 211d in a thickness direction of the side-surface wall sections 211b, 211d.

The second mounting holes 217, 218 are arranged at an interval in the longitudinal direction Y in a vertical posture.

The fall prevention member 216 is a member for preventing the planar light source 2 from falling from the mounting member 203.

As illustrated in FIG. 17, the fall prevention member 216 is a cord-like member and includes a mounting-side fixing section 225 fixed to the main body wall section 210, a panel-side fixing section 226 that can be fixed to the back surface of the planar light emitting panel 10, and a connecting section 227 connecting the mounting-side fixing section 225 and the panel-side fixing section 226.

In the fall prevention member 216, the mounting-side fixing section 225 which is one end section is supported in a cantilever manner by the main body wall section 210, and the panel-side fixing section 226 is a free end.

Subsequently, the positional relationship of each member when the illumination apparatus 200 is attached to the mounting surface 500 will be described.

First, a case where the illumination apparatus 200 is mounted to the mounting surface 500 in the vertical posture will be described.

Figure 18:
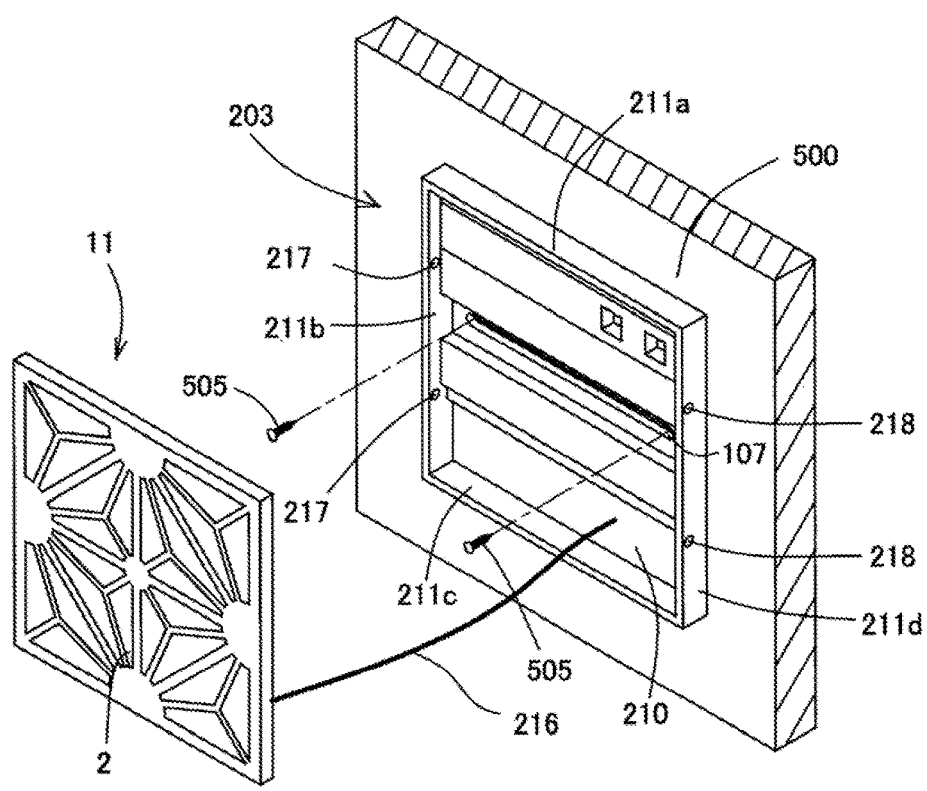
FIG. 18 is a perspective view when the illumination apparatus illustrated in FIG. 16 is assembled in a case where the illumination apparatus is installed on the mounting surface in the vertical posture.

As can be seen from FIG. 18, in the illumination apparatus 200, the planar light source 2 is fixed in the vertical posture to the mounting surface 500 by the mounting member 203. That is, in the illumination apparatus 200, the light emitting surface 12 of the planar light source 2 is parallel to the mounting surface 500.

Specifically, the fastening element 505 such as a screw is inserted into the mounting hole 107, and the mounting member 203 is fixed to the mounting surface 500.

Both end surfaces of the planar light source 2 in the lateral direction are covered with the side-surface wall sections 211a, 211c, and both end surfaces of the planar light source 2 in the longitudinal direction are covered with side-surface wall sections 211b, 211d. That is, the second mounting holes 217, 218 of the side-surface wall sections 211b, 211d are blocked by the end surfaces of the planar light source 2.

The front surface of the planar light source 2 is flush with the side-surface wall sections 211a to 211d.

The fall prevention member 216 is interposed between the main body wall section 210 of the mounting member 203 and the back surface of the planar light emitting panel 10. The panel-side fixing section 226 on the free-end side is fixed to the back surface of the planar light emitting panel 10.

Subsequently, a case where the illumination apparatus 200 is mounted to the mounting surface 500 in the horizontal posture will be described.

Figure 19:
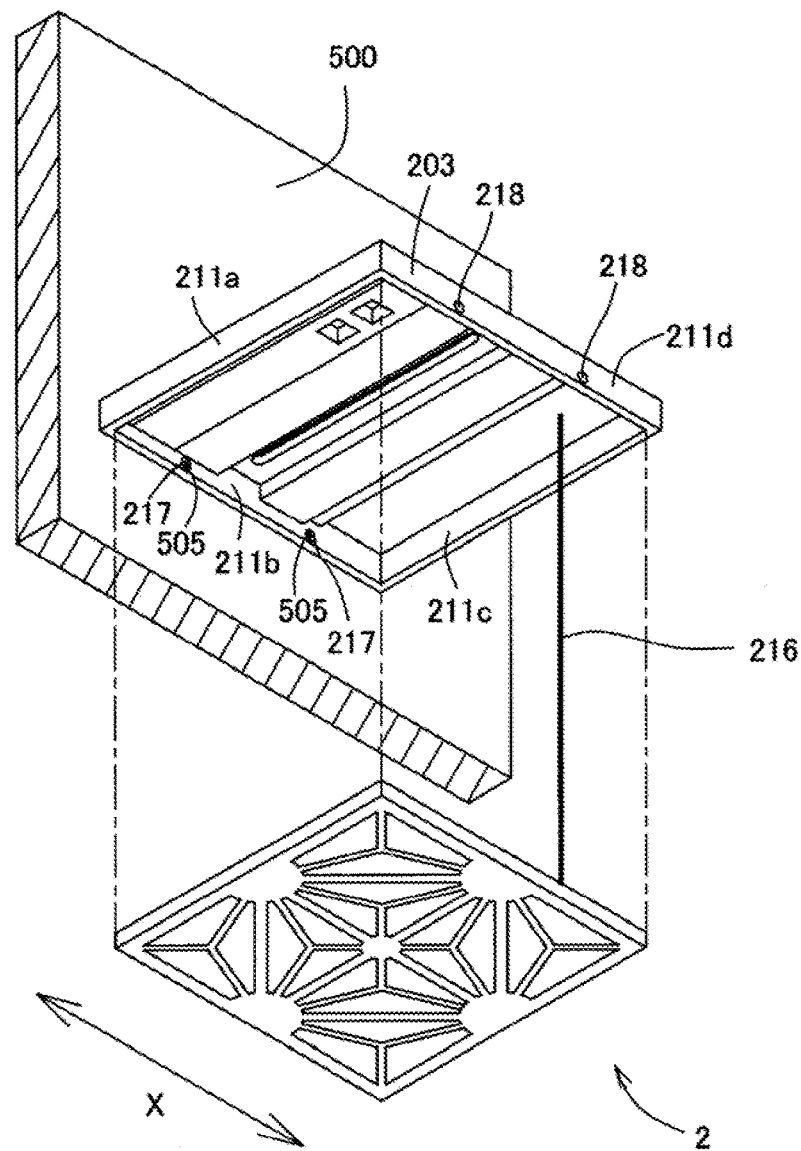
FIG. 19 is a perspective view when the illumination apparatus illustrated in FIG. 16 is assembled in a case where the illumination apparatus is installed on the mounting surface in a horizontal posture.

As can be seen from FIG. 19, in the illumination apparatus 200, the planar light source 2 is fixed in the horizontal posture to the mounting surface 500 by the mounting member 203. That is, in the illumination apparatus 200, the light emitting surface 12 of the planar light source 2 spreads also in a direction perpendicular to the mounting surface 500.

Figure 20:
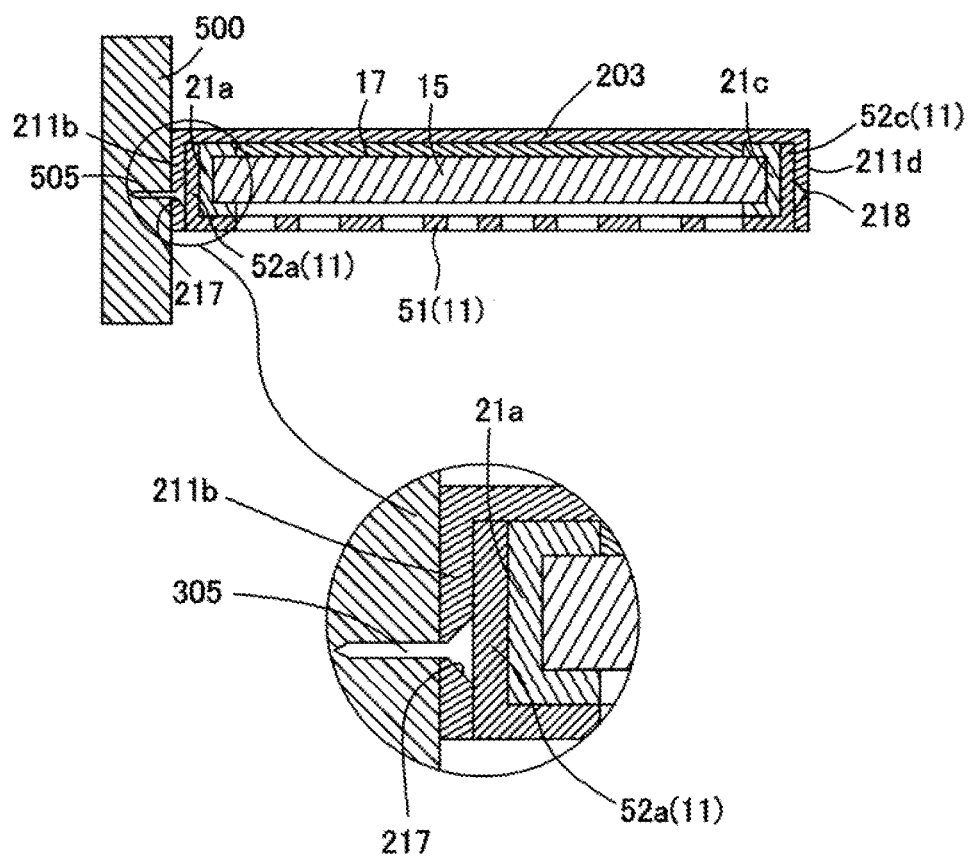
FIG. 20 is a cross-sectional view of the illumination apparatus in the horizontal posture illustrated in FIG. 19.

Specifically, the fastening elements 505 such as screws are inserted into the second mounting holes 217, 217, and the mounting member 203 is fixed to the mounting surface 500. As illustrated in FIG. 20, the both end surfaces of the planar light source 2 in the depth direction are covered with the side-surface wall sections 211b, 211d, and the both end surfaces of the planar light source 2 in the lateral direction are covered with the side-surface wall sections 211a, 211c. That is, the second mounting holes 217, 217 of the side-surface wall section 211b and head sections of the fastening elements 505 are blocked by the end surface of the planar light source 2.

According to the illumination apparatus 200 of the second embodiment, since the posture of the planar light source 2 with respect to the mounting surface 500 can be changed, there are few restrictions on the installation place.

According to the illumination apparatus 200 of the second embodiment, the fastening element 505 is hardly disengaged since the removal direction of the fastening element 505 is blocked by the end surface of the light emitting panel when the planar light source 2 is installed in the horizontal posture.

According to the illumination apparatus 200 of the second embodiment, since the fall prevention member 216 is provided, it is possible to prevent the planar light source 2 from dropping onto the ground even if the planar light source 2 is detached from the mounting member 203.

Subsequently, a planar light source 250 according to a third embodiment will be described. Note that identical reference numerals are given to configurations identical to those of the illumination apparatuses 1, 200 of the first and second embodiments, and the description thereof will be omitted.

The planar light source 250 of the third embodiment differs from the planar light source 2 of the first embodiment in the shape of the pattern forming section.

Figure 21:
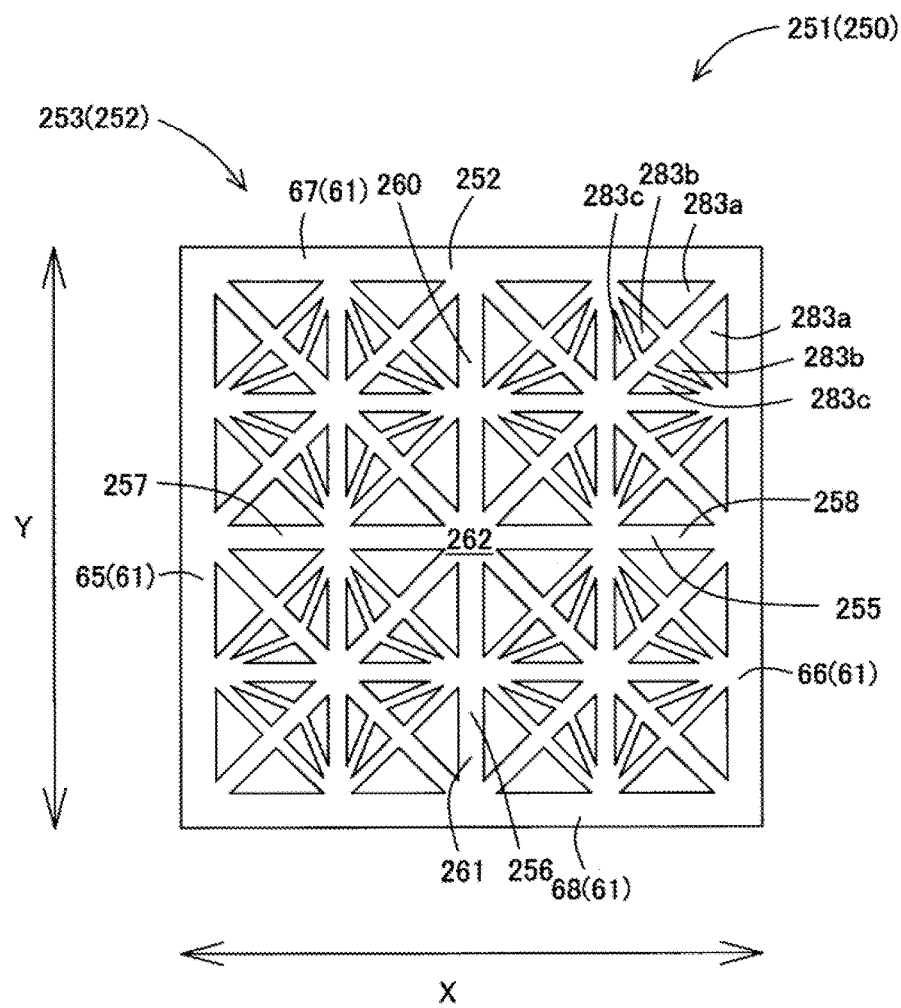
FIG. 21 is a front view of a decorative member according to a third embodiment of the present invention.

As illustrated in FIG. 21, a pattern forming section 252 of a decorative member 251 of the planar light source 250 includes a frame shielding section 61 and a light-emission shielding section 253.

The light-emission shielding section 253 includes a lateral shielding section 255 horizontally crossing a light emitting region 30 of a planar light emitting panel 10, and a longitudinal shielding section 256 vertically crossing the light emitting region 30 of the planar light emitting panel 10 when viewed from the front.

As illustrated in FIG. 21, the lateral shielding section 255 includes connecting shielding sections 257, 258, and a central intersection 262.

The connecting shielding section 257 connects a longitudinally extending section 65 and the central intersection 262, and the connecting shielding section 258 connects the central intersection 262 and a longitudinally extending section 66. The connecting shielding sections 257, 258 extend linearly in a lateral direction X.

As illustrated in FIG. 21, the longitudinal shielding section 256 includes connecting shielding sections 260, 261, and the central intersection 262.

The connecting shielding section 260 connects a laterally extending section 67 and the central intersection 262, and the connecting shielding section 261 connects the central intersection 262 and a longitudinally extending section 67. The connecting shielding sections 260, 261 extend linearly in a longitudinal direction Y.

The central intersection 262 is a section located at the center of the light-emission shielding section 253, and is a section where the lateral shielding section 255 and the longitudinal shielding section 256 intersect. The central intersection 262 is a section where the connecting shielding sections 257, 258, 260, 261 merge.

Figure 22A:
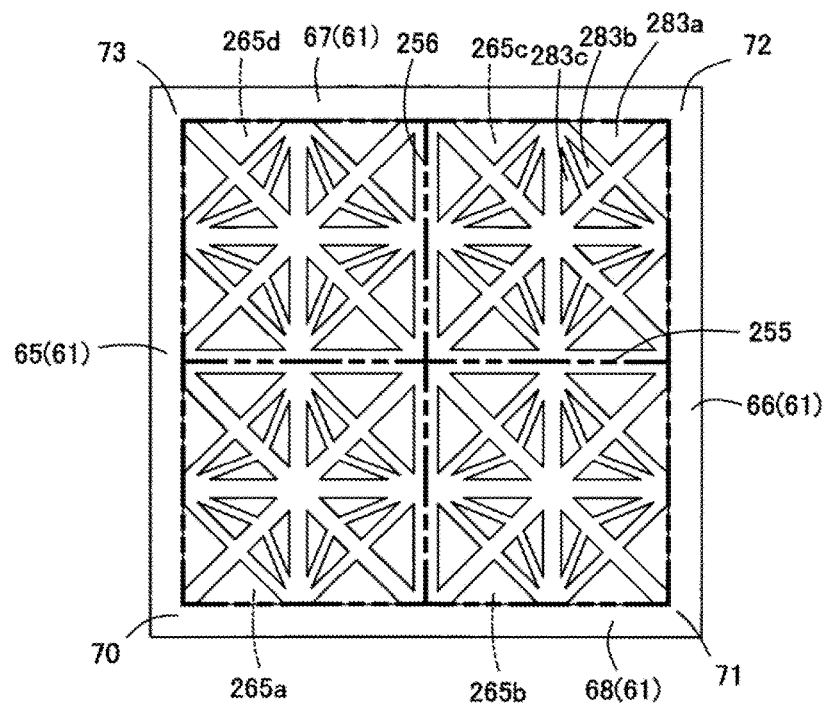

As illustrated in FIG. 22A, the light-emission shielding section 253 is divided into four first regions 265a to 265d by the lateral shielding section 255 and the longitudinal shielding section 256.

Each of the first regions 265a to 265d is a rectangular region, and specifically a square region.

The first region 265a and the first region 265b are in line symmetry with the first region 265d and the first region 265c with the lateral shielding section 255 as the axis of symmetry. The first region 265a and the first region 265d are in line symmetry with the first region 265b and the first region 265c with the longitudinal shielding section 256 as the axis of symmetry.

Figure 22B:
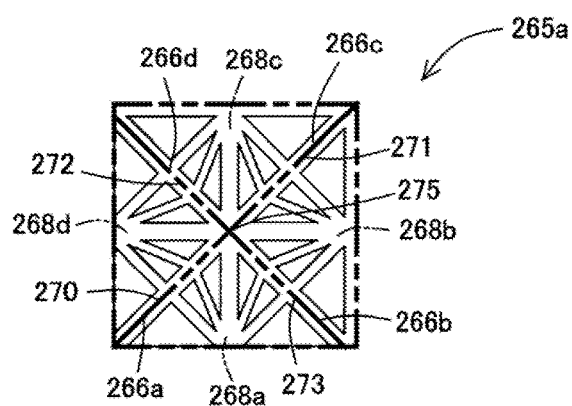

As can be seen from FIG. 22B, in each of the first regions 265a to 265d, second connecting shielding sections 266a to 266d are provided. Each of the first regions 265a to 265d is divided into four second regions 268a to 268d by the second connecting shielding sections 266a to 266d.

The second connecting shielding sections 266a to 266d form an "X" shaped section in front view, and include shielding sections 270 to 273 and an intersection 275.

The shielding section 270 is a section connecting the frame intersection 70 to 73 and the intersection 275, and the shielding section 271 is a section connecting the intersection 275 and the central intersection 262. The shielding sections 270, 271 linearly extend in an oblique direction and are linearly arranged. That is, each of the second connecting shielding sections 270, 271 has a lateral X component and a longitudinal Y component when viewed from the front.

The shielding section 272 is a section connecting the middle section of the longitudinally extending section 65, 66 and the intersection 275, and the shielding section 273 is a section connecting the intersection 275 and the middle section of the laterally extending section 67, 68. The shielding sections 272, 273 linearly extend in an oblique direction and are linearly arranged in a direction crossing the shielding sections 270, 271. That is, each of the shielding sections 272, 273 has a lateral component and a longitudinal component when viewed from the front.

The intersection 275 is a section where the shielding sections 270 to 273 merge. Each of the second regions 268a to 268d is a right triangular region, and is 4-fold rotational symmetrical with the intersection 275 as the axis of symmetry.

Figure 22C:
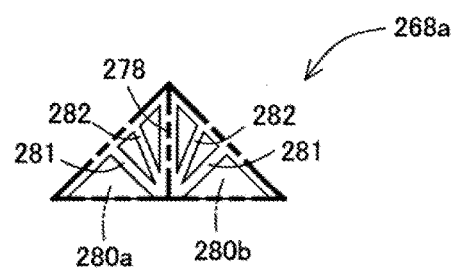

As illustrated FIG. 22C, in each of the second regions 268a to 268d, a third connecting shielding section 278 extending from a right-angled corner section toward a hypotenuse is provided. Each of the second regions 268a to 268d is divided into two third regions 280a, 280b by the third connecting shielding section 278.

Each of the third regions 280a, 280b is a right triangular region, has a fourth connecting shielding section 281 and a fifth connecting shielding section 282 extending from a right-angled corner section toward a hypotenuse.

The fourth connecting shielding section 281 is a section which extends so as to be a bisector of the right-angled corner section. The fifth connecting shielding section 282 is a section which extends so as to be a bisector of the corner section formed by the fourth connecting shielding section 281 and the third connecting shielding section 278.

The third regions 280a, 280b are in line symmetrical with the third connecting shielding section 278 as the axis of symmetry.

As can be seen from FIGS. 21 and 22A, each of the third regions 280a, 280b is provided with a plurality of types of light transmitting holes 283a, 283b, 283c.

The light transmitting holes 283a, 283b, 283c are holes through which light from the light emitting region 30 of the planar light emitting panel 10 can pass, and are through holes penetrating in a thickness direction of the main body plate section 51. Each of the light transmitting holes 283a, 283b, 283c has a triangular shape.

The light transmitting holes 283a, 283b, 283c are holes provided in each of the third regions 280a, 280b, and are holes partitioned by the fourth connecting shielding section 281 and the fifth connecting shielding section 282.

Subsequently, a state in which the planar light source 250 is turned on and a state in which the planar light source 250 is turned off will be described.

Figure 23A:
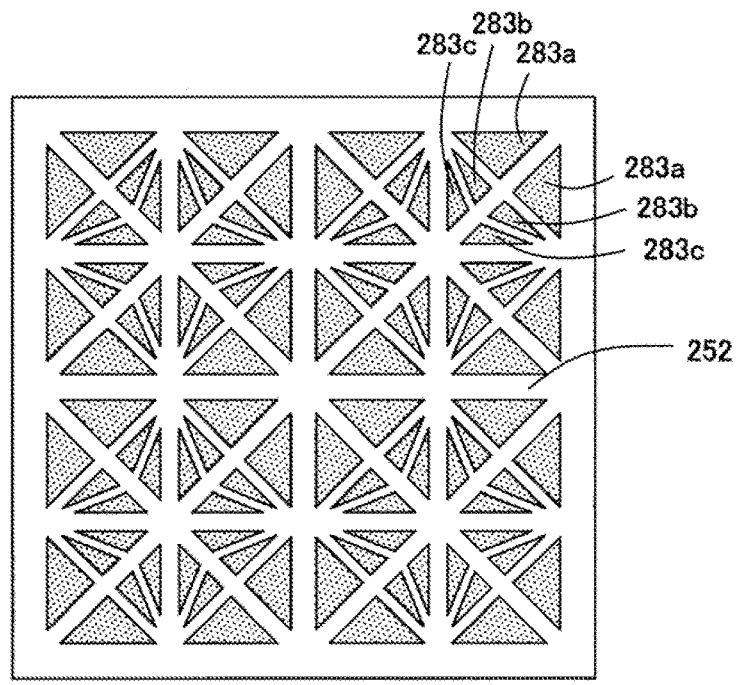

As illustrated in FIG. 23A, in a state where the planar light source 250 is turned on, part of light from the light emitting region 30 is shielded by the pattern forming section 252, and a pattern along the shape of the pattern forming section 252 is reflected. That is, light from the light emitting region 30 passes through the respective light transmitting holes 283a to 283c and radiates into the living space 501 side, and only the sections where the light transmitting holes 283a to 283c are formed emit light.

Figure 23B:
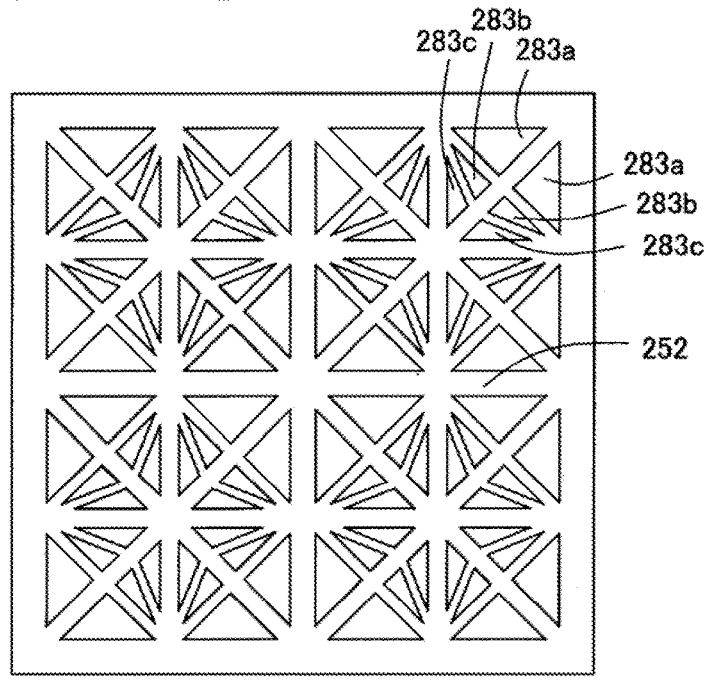

In contrast, as illustrated in FIG. 23B, in a state where the planar light source 250 is turned off, part of the light emitting region 30, laid bare through the decorative member 251 also becomes a mirror surface, and constitutes one mirror surface together with the pattern forming section 252 of the decorative member 251.

The planar light source 250 of the third embodiment has a greater shielding rate of irradiation light from the light emitting region 30, which is shielded by the light-emission shielding section 253, than each of the shielding rates of the planar light sources 2a, 2b of the first embodiment. Therefore, the planar light source 250 can exhibit a darker color in a turn-on state in a case where the planar light source 250 is arranged side by side with the planar light sources 2a, 2b of the first embodiment.

Subsequently, a planar light source 300 according to a fourth embodiment will be described. Note that identical reference numerals are given to configurations identical to those of the planar light sources 2a, 2b, 250 of the first to third embodiments, and the description thereof will be omitted.

Figure 24:
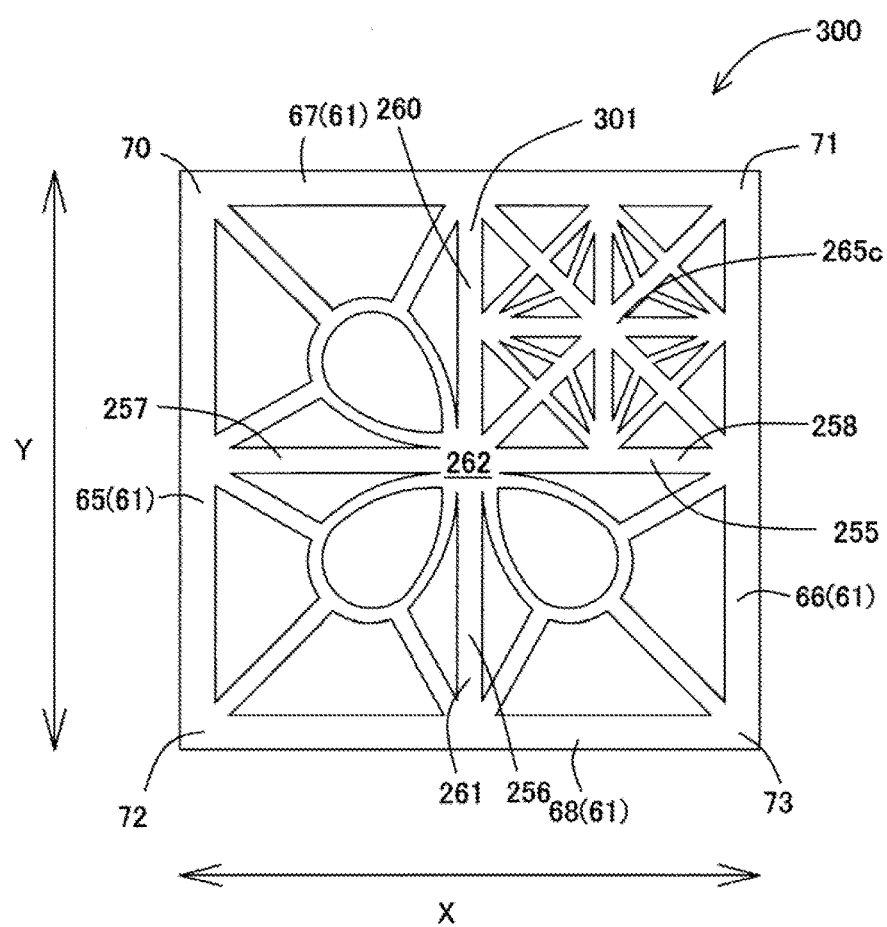
FIG. 24 is a front view of a planar light source according to a fourth embodiment of the present invention.

The planar light source 300 of the fourth embodiment differs from the planar light source 250 of the third embodiment in the shape of part of the light-emission shielding section as illustrated in FIG. 24.

Figure 25A:
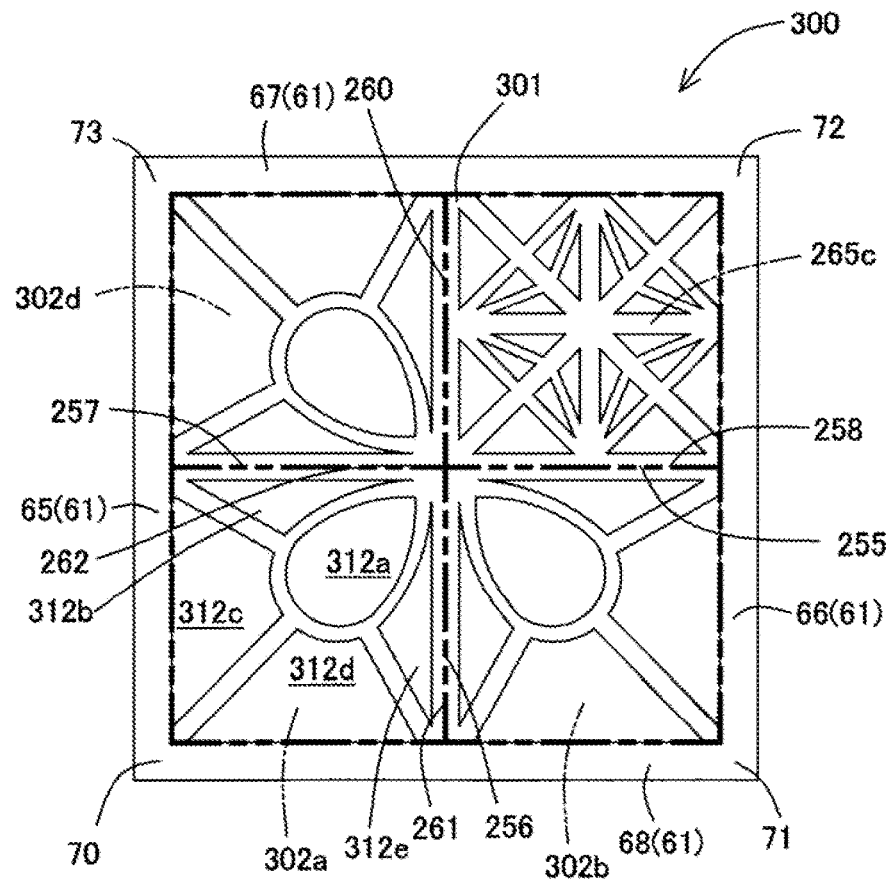

Similarly to the light-emission shielding section 253 of the third embodiment, as illustrated in FIG. 25A, a light-emission shielding section 301 of the planar light source 300 is divided into four first regions 302a, 302b, 265c, 302d by a lateral shielding section 255 and a longitudinal shielding section 256.

Each of the first regions 302a, 302b, 302d is a rectangular region, and specifically has a square shape.

The first region 302a is in line symmetry with the first region 302d with the lateral shielding section 255 as the axis of symmetry, and is in line symmetry with the first region 302b with the longitudinal shielding section 256 as the axis of symmetry.

Figure 25B:
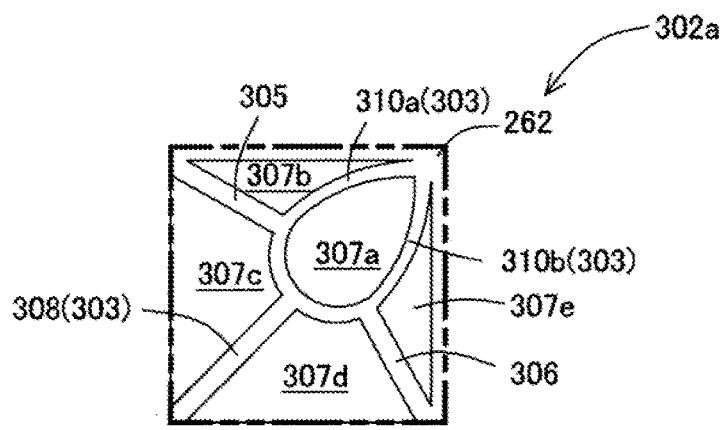

As can be seen from FIG. 25B, the first region 302a (302b, 302d) is divided into five divided regions 307a to 307e by a second connecting shielding section 303 and second branch shielding sections 305, 306.

The second connecting shielding section 303 is a section that crosses the first region 302a (302b, 302d) in an oblique direction and is a section that connects a frame intersection 70 (71 to 73) and a central intersection 262.

The second connecting shielding section 303 is composed of a common shielding section 308 and branch shielding sections 310a, 310b.

The common shielding section 308 is a section linearly extending from the frame intersection 70 toward the central intersection 262. The branch shielding sections 310a, 310b are sections which branch off from an end section of the common shielding section 308, extend in a curved manner, and merge at the central intersection 262.

The second branch shielding section 305 is a section which connects to a longitudinally extending section 65(66) from a middle section of the branch shielding section 310a. The second branch shielding section 306 is a section which connects to a laterally extending section 68(67) from a middle section of the branch shielding section 310b.

As can be seen from FIG. 25A, each of the first regions 302a, 302b, 302d is provided with five types of light transmitting holes 312a to 312e.

The light transmitting holes 312a to 312e are holes through which light from a light emitting region 30 of a planar light emitting panel 10 can pass, and are through holes penetrating in a thickness direction of a main body plate section 51.

The light transmitting holes 312a to 312e are holes provided in each of the first regions 302a, 302b, 302d, and are holes partitioned by the second connecting shielding section 303 and the second branch shielding sections 305, 306. That is, the light transmitting holes 312a to 312e are holes corresponding to the divided regions 307a to 307e, respectively.

Subsequently, a state in which the planar light source 300 is turned on and a state in which the planar light source 300 is turned off will be described.

Figure 26A:
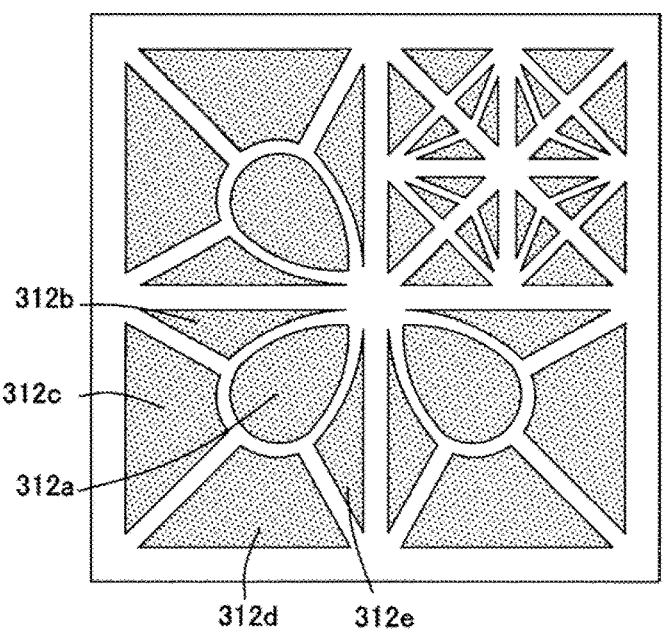

As illustrated in FIG. 26A, in a state where the planar light source 300 is turned on, part of light from the light emitting region 30 is shielded by the light-emission shielding section 301, and a pattern along the shape of each shielding section of the light-emission shielding section 301 is reflected. That is, light from the light emitting region 30 passes through the light transmitting holes 312a to 312e and radiates into the living space 501 side, and only the sections where the light transmitting holes 312a to 312e are formed emit light.

Figure 26B:
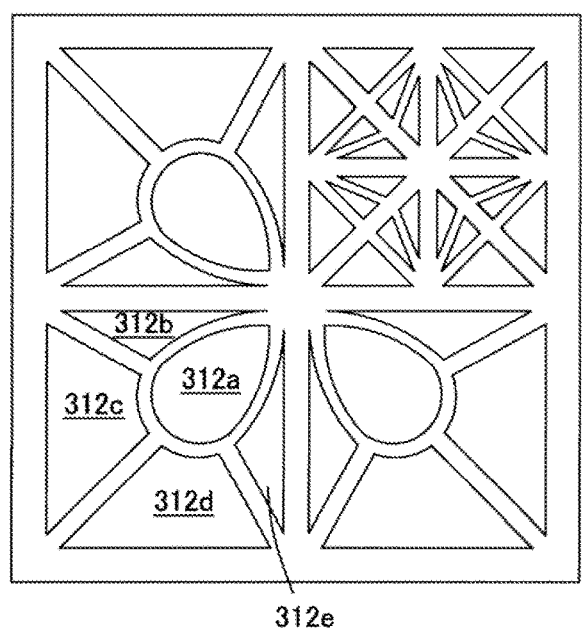

As illustrated in FIG. 26B, in a state where the planar light source 300 is turned off, part of the light emitting region 30, which is not shielded by a decorative member, also becomes a mirror surface, and constitutes one mirror surface together with a pattern forming section of the decorative member.

According to the planar light source 300 of the fourth embodiment, since the first regions 302a, 302b, 265c, 302d having different shapes are provided, difference in light intensity can be generated within the planar light source 300 due to the difference in shielding rate.

Subsequently, a planar light source 350 according to a fifth embodiment will be described. Note that identical reference numerals are given to configurations identical to those of the planar light sources 2a, 2b, 250, 300 of the first to fourth embodiments, and the description thereof will be omitted.

Figure 27:
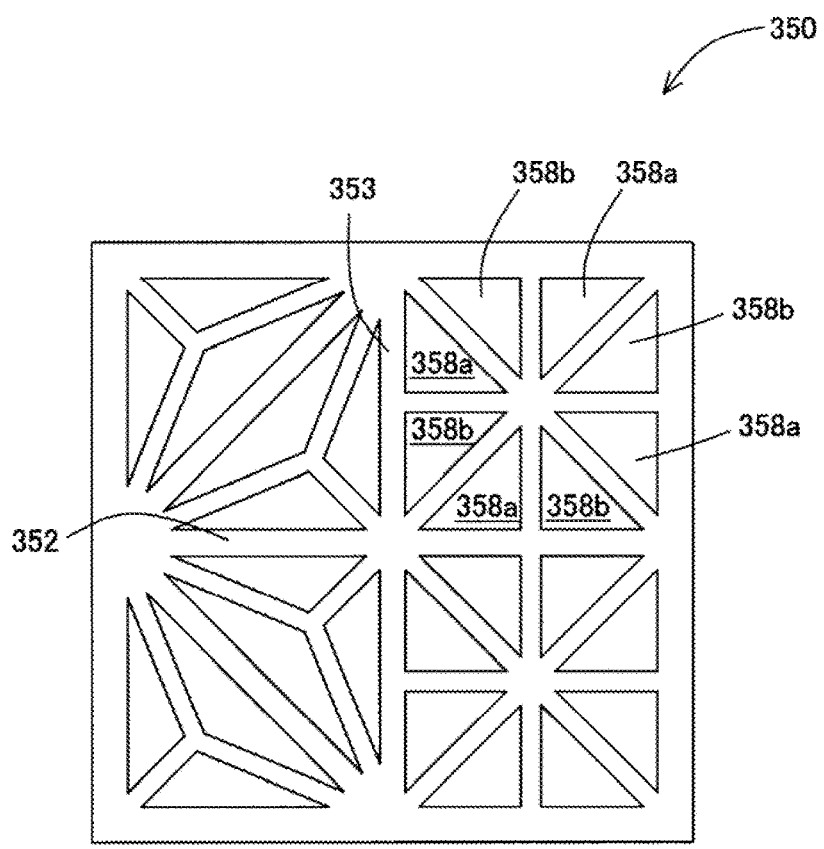
FIG. 27 is a front view of a planar light source according to a fifth embodiment of the present invention.

The planar light source 350 of the fifth embodiment differs from the planar light source 250 of the third embodiment in the shape of part of the light-emission shielding section as illustrated in FIG. 27.

Figure 28A:
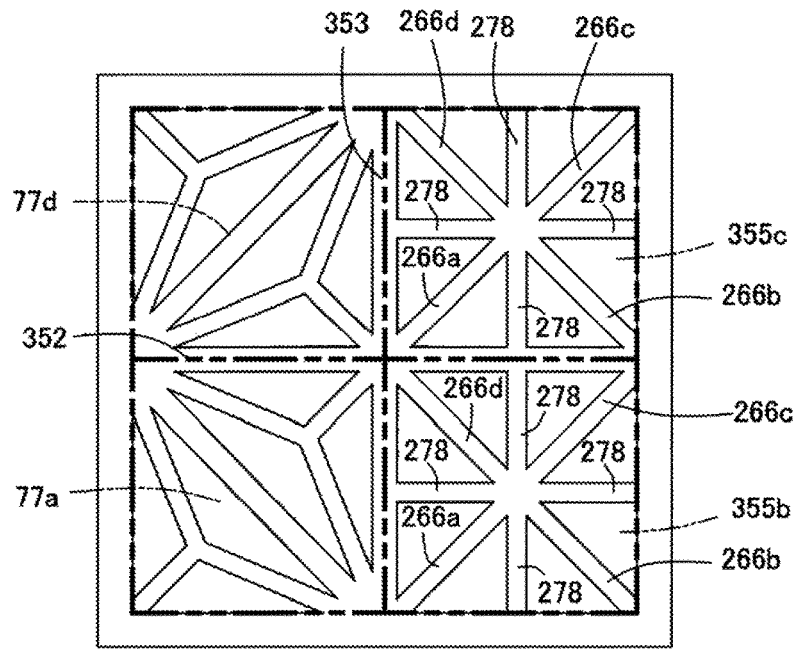

Similarly to the light-emission shielding section 253 of the third embodiment, as illustrated in FIG. 28A, a light-emission shielding section 351 of the planar light source 350 is divided into four first regions 77a, 355b, 355c, 77d by a lateral shielding section 352 and a longitudinal shielding section 353.

Each of the first regions 355b, 355c is a rectangular region, and specifically has a square shape.

The first region 355b and the first region 355b are in line symmetrical with the lateral shielding section 352 as the axis of symmetry.

Figure 28B:
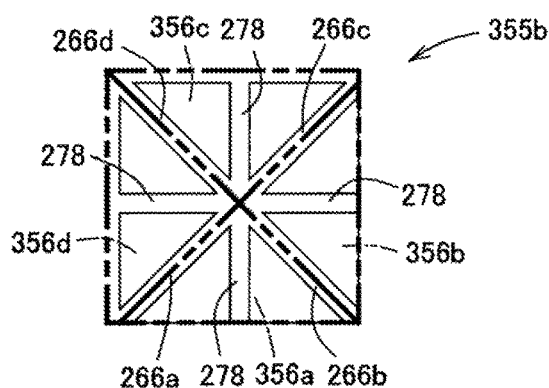

As can be seen from FIG. 28B, in each of the first region 355b, 355c, second connecting shielding sections 266a to 266d are provided. Each of the first regions 355b, 355c is divided into four second regions 356a to 356d by the second connecting shielding sections 266a to 266d.

Figure 28C:
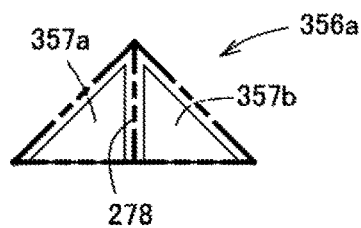

As illustrated in FIG. 28C, in each of the second regions 356a to 356d, a third connecting shielding section 278 extending from a right-angled corner section toward a hypotenuse is provided. Each of the second regions 356a to 356d is divided into two third regions 357a, 357b by the third connecting shielding section 278.

The third regions 357a, 357b differ from the third regions 280a, 280b of the third embodiment in that the third regions 357a, 357b do not include the fourth connecting shielding section 281 and the fifth connecting shielding section 282.

As can be seen from FIGS. 27 and 28C, the third regions 357a, 357b are provided with two types of light transmitting holes 358a, 358b.

The light transmitting holes 358a, 358b are holes through which light from the light emitting region 30 of the planar light emitting panel 10 can pass, and are through holes penetrating in the thickness direction of the main body plate section 51. Each of the light transmitting holes 358a, 358b has a triangular shape.

The light transmitting holes 358a, 358b are holes provided in the third regions 357a, 357b, and are holes partitioned by the third connecting shielding section 278.

In the above-described embodiments, the first regions of different embodiments of the planar light source may be combined.

Figure 29A:
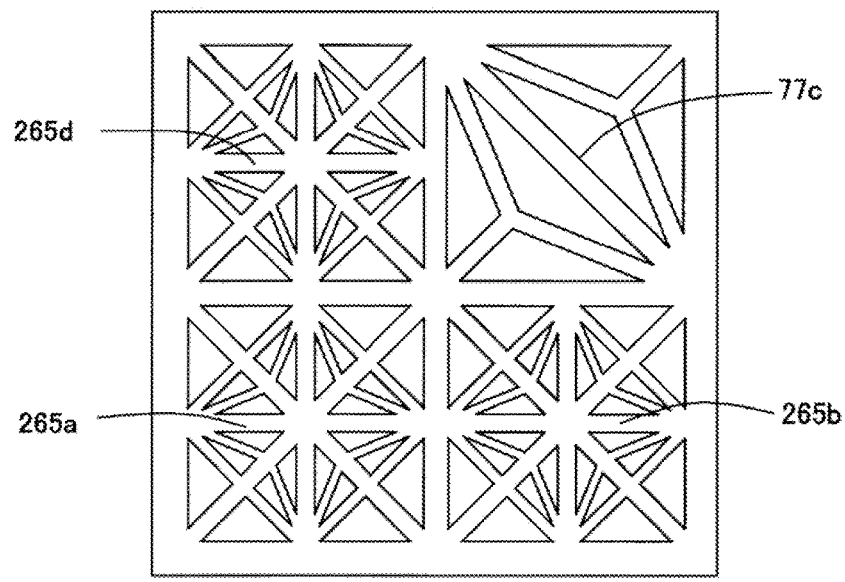
Figure 29B:
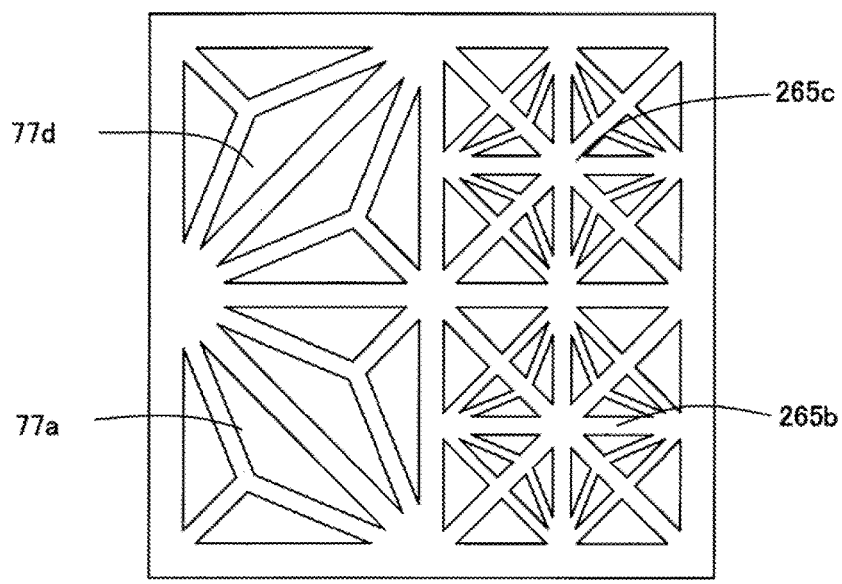

For example, as illustrated in FIG. 29A, one first region 77a of the first embodiment and three first regions 265a, 265b, 265d of the third embodiment may be combined (sixth embodiment). As illustrated in FIG. 29B, two first regions 77a, 77d of the first embodiment and two first regions 265b, 265c of the third embodiment may be combined (seventh embodiment).

In the above-described embodiments, the light emitting region is divided by four or more shielding sections of the light-emission shielding section; however, the present invention is not limited to this. The light emitting region may be divided by three or less shielding sections.

Figure 30A:
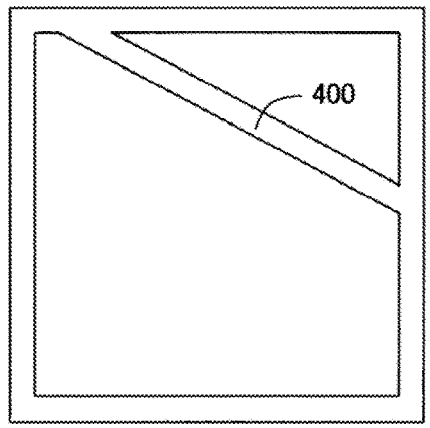
Figure 30B:
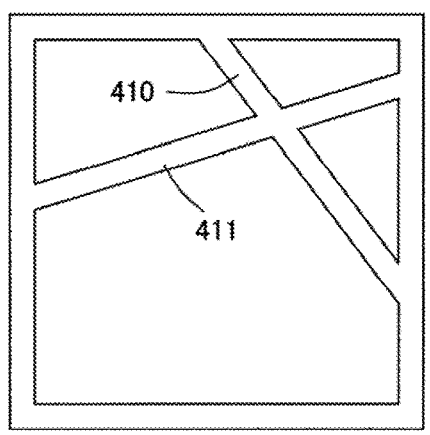
Figure 30C:
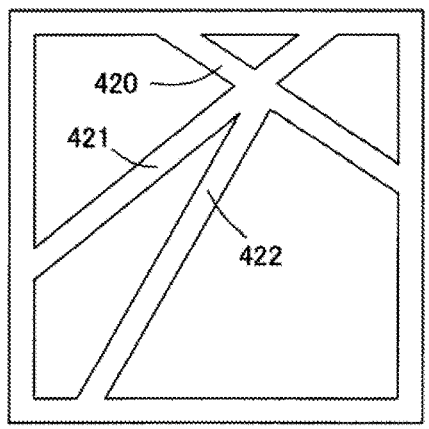

For example, as illustrated in FIG. 30A, a light emitting region may be divided into two regions by one shielding section 400 (eighth embodiment). As illustrated in FIG. 30B, a light emitting region may be divided into four regions by two shielding sections 410, 411 crossing each other (ninth embodiment). As illustrated in FIG. 30C, a light emitting region may be divided into five regions by three shielding sections 420, 421, 422 (tenth embodiment).

Figure 31:
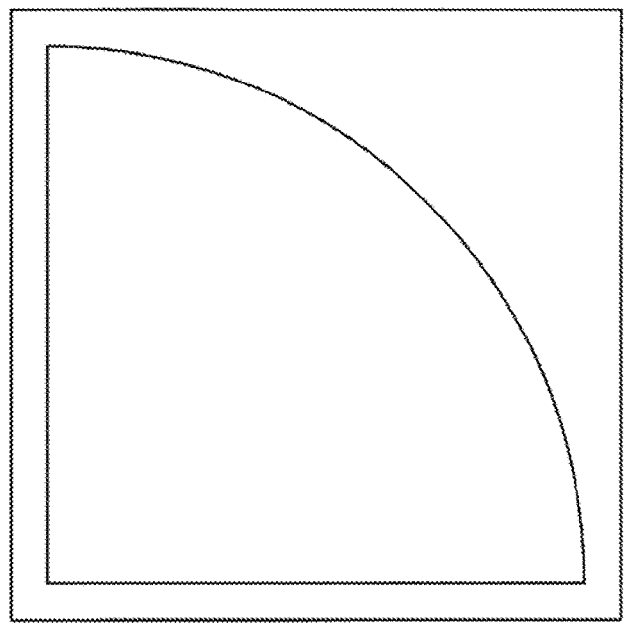
FIG. 31 is a front view illustrating an example of a planar light source constituting an illumination apparatus according to another embodiment of the present invention.

In the above-described first embodiment, the light-emission shielding section divides the light emitting region 30 in each of the planar light sources 2. However, the present invention is not limited to this, and it is sufficient that a light-emission shielding section divides a light emitting region in at least one planar light source from among the planar light sources which constitute an illumination apparatus. For example, in a planar light source which is one type of the planar light sources constituting the illumination apparatus, a light-emission shielding section may not divide a light emitting region and may have a fan-shaped light transmitting hole as illustrated in FIG. 31.

In the above embodiments, the color of the cathode layer is reflected on the light emitting region 30 of the planar light emitting panel 10 and the light emitting region 30 constitutes a mirror surface when the planar light source is turned off; however, the present invention is not limited to this. The color of an anode layer may be reflected on a light emitting region of a planar light emitting panel and may constitute a mirror surface when the planar light source is turned off.

In the above-described first embodiment, the nine planar light sources 2 are mounted to the one mounting member; however, the present invention is not limited to this. Two or more and eight or less planar light sources 2 may be mounted to one mounting member, or ten or more planar light sources 2 may be mounted to one mounting member.

Figure 32:
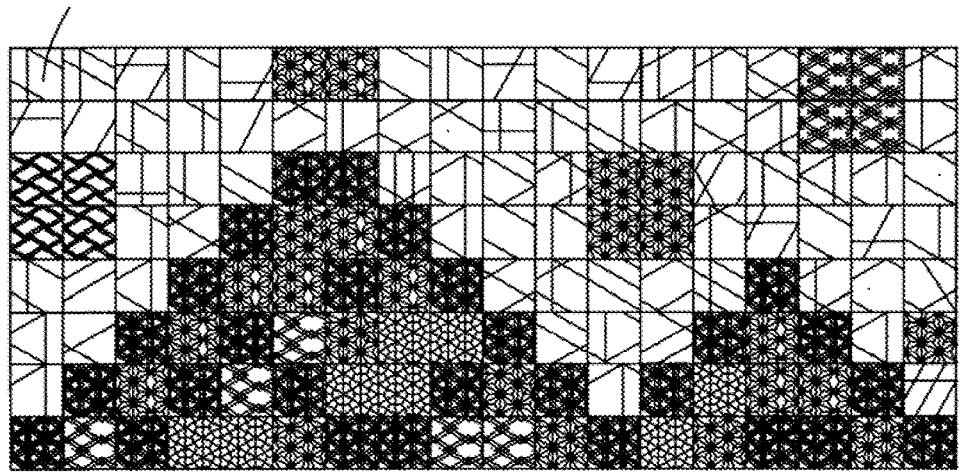
FIG. 32 is a front view illustrating an illumination apparatus according to another embodiment of the present invention.

In the above-described first embodiment, the case of the planar light source having two types of pattern forming sections has been described; however, the present invention is not limited to this. An illumination apparatus may be formed of only planar light sources having one type of pattern forming sections. Alternatively, as illustrated in FIG. 32, planar light sources having three or more types of pattern forming sections may mixedly exist. In this case, as illustrated in FIG. 32, it is preferable to form a single pattern or a single picture pattern such as a mountain pattern with a large number of planar light sources.

In the above embodiments, the planar light emitting panel is mounted to the mounting member by magnetic force between the reinforcing plate and the mounting member; however, the present invention is not limited to this. For example, a decorative member may be formed of a ferromagnetic material, and a planar light emitting panel may be mounted to a mounting member by magnetic force between the decorative member and the mounting member.

In the above-described embodiments, the reinforcing plate is formed of a ferromagnetic material and the magnetic force generating section is provided to the mounting member to generate magnetic force between the reinforcing plate and the mounting member. However, the present invention is not limited to this. Part of a mounting member may be formed of a ferromagnetic section and a magnetic force generating section may be provided on a reinforcing plate to generate magnetic force between the reinforcing plate and the mounting member.

In the above-described embodiments, the planar light emitting panel is mounted to the mounting member by magnetic force; however, the present invention is not limited to this. For example, a planar light emitting panel may be mounted to a mounting member by using an engaging relationship, an adhesive means or the like.

Figure 33:
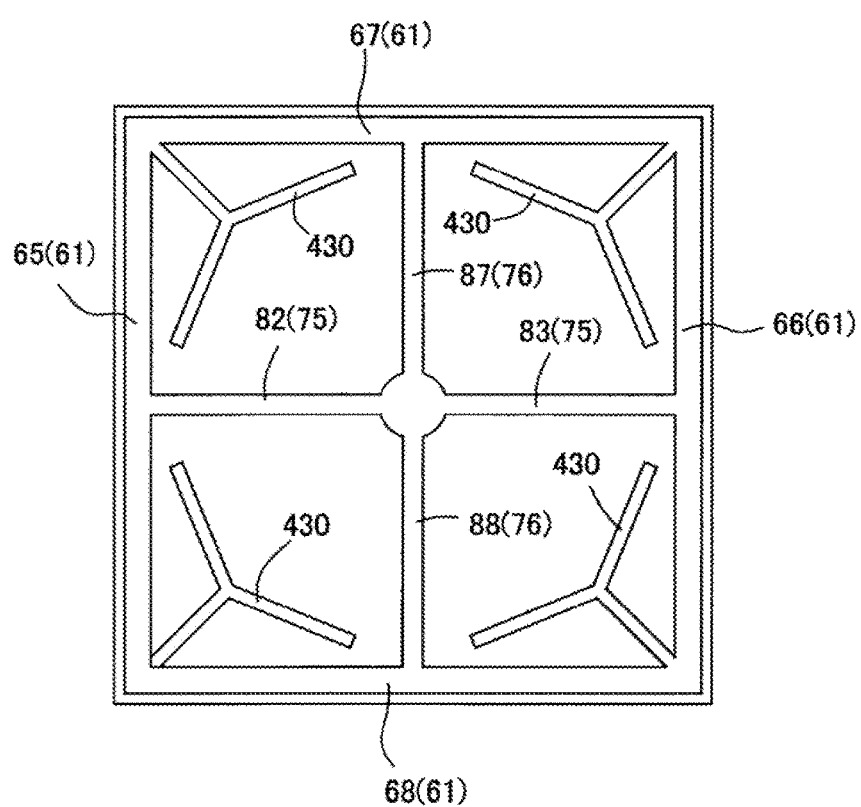
FIG. 33 is a front view of a planar light source according to another embodiment of the present invention.

In the above-described embodiments, in the light-emission shielding section, the region inside the frame shielding section is completely divided into a plurality of regions by the lateral shielding section 75, the longitudinal shielding section 76, and the like. However, the present invention is not limited to this. For example, as in a light-emission shielding section 430 illustrated in FIG. 33, there may be a section part of which is not connected.

Figure 34A:
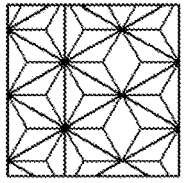
Figure 34B:
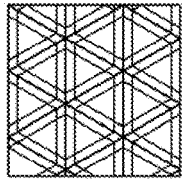
FIG. 34B illustrates a case of the goma (sesame) pattern.
Figure 34C:
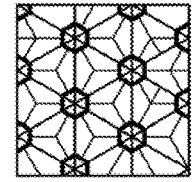
FIG. 34C illustrates a case of the sakura (cherry blossom) pattern.
Figure 34D:
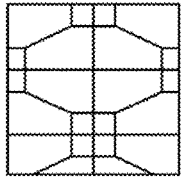
FIG. 34D illustrates a case of the shokko pattern (lattice pattern with rectangles or octangles)
Figure 34E:
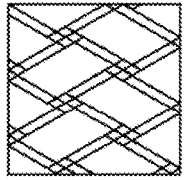
FIG. 34E illustrates a case of the sayagatakuzushi pattern (deformed-swastika pattern)
Figure 34F:
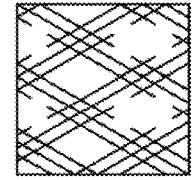
FIG. 34F illustrates a case of the izutsu waribishi pattern (pattern of combined diamonds)
Figure 34G:
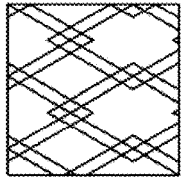
FIG. 34G illustrates a case of the waribishi tsunagi pattern (pattern of repeated diamonds divided into four parts)
Figure 34H:
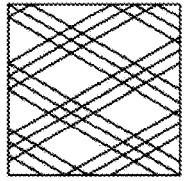
FIG. 34H illustrates a case of the miebishi pattern (triple diamond pattern)
Figure 34I:
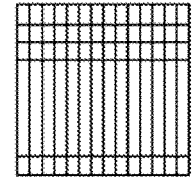
FIG. 34I illustrates a case of the senbon goushi pattern (vertically long lattice pattern)
Figure 34J:
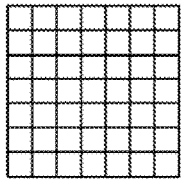
FIG. 34J illustrates a case of the masu goshi pattern (pattern of square checks)
Figure 34K:
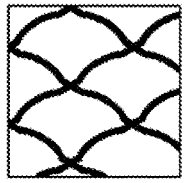
FIG. 34K illustrates a case of the seigaiha pattern (wave pattern)
Figure 34L:
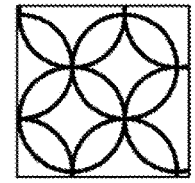
FIG. 34L illustrates a case of the shippo pattern (pattern of overlapping circles divided into quarters)
Figure 34M:
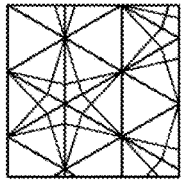
FIG. 34M illustrates a case of the kasane rindo pattern (pattern of overlapped autumn bellflowers)
Figure 34N:
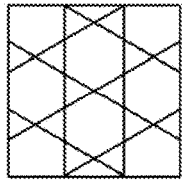
FIG. 34N illustrates a case of the kagome pattern (wickerwork pattern)
Figure 34O:
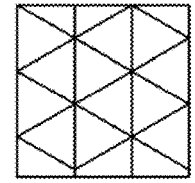
FIG. 34O illustrates a case of the mitsukumite kikko pattern (pattern of diamonds divided into two equilateral triangles)
Figure 34P:
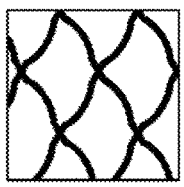
FIG. 34P illustrates a case of the fundo watsunagi pattern (repeated counterweight pattern)
Figure 34Q:
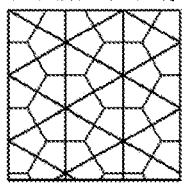

In the above-described embodiments, the pattern forming section has the kakuasa pattern (pattern of a hemp leaf surrounded by a square); however, the present invention is not limited to this. For example, as illustrated in FIGS. 34A to 34Q, the pattern forming section may have a Japanese traditional muntin pattern such as the asanoha (hemp leaf) pattern, the goma (sesame) pattern, the sakura (cherry blossom) pattern, the shokko pattern (lattice pattern with rectangles or octangles), the sayagatakuzushi pattern (deformed-swastika pattern), the izutsu waribishi pattern (pattern of combined diamonds), the waribishi tsunagi (pattern of repeated diamonds divided into four parts) the miebishi pattern (triple diamond pattern), the senbon goushi pattern (vertically long lattice pattern), the masu goshi pattern (pattern of square checks), the seigaiha pattern (wave pattern), the shippo pattern (pattern of overlapping circles divided into quarters), the kasane rindo pattern (pattern of overlapped autumn bellflowers), the kagome pattern (wickerwork pattern) the mitsukumite kikko pattern (pattern of diamonds divided into two equilateral triangles), the fundo watsunagi pattern (repeated counterweight pattern), or the tsumiishi kikko pattern (hexagonal pattern like piled rocks).

Figure 35A:
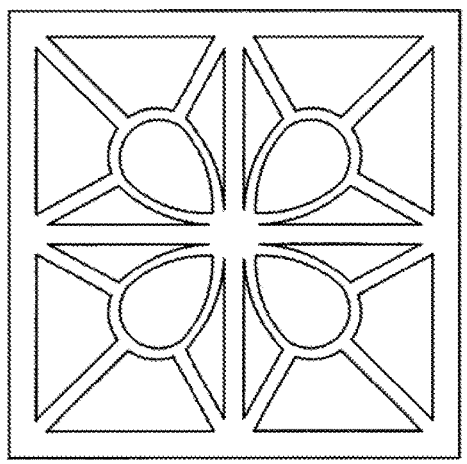
Figure 35B:
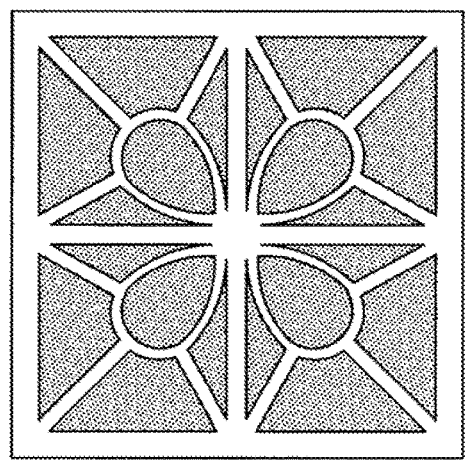
Figure 35C:
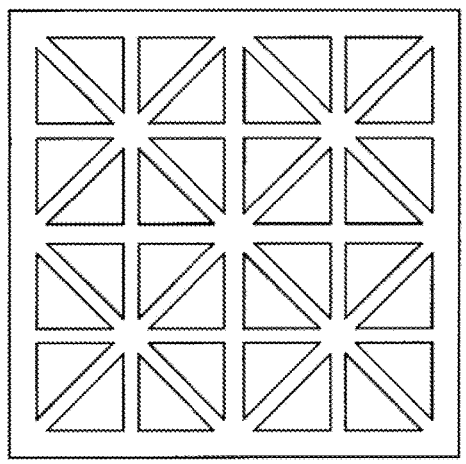
Figure 35D:
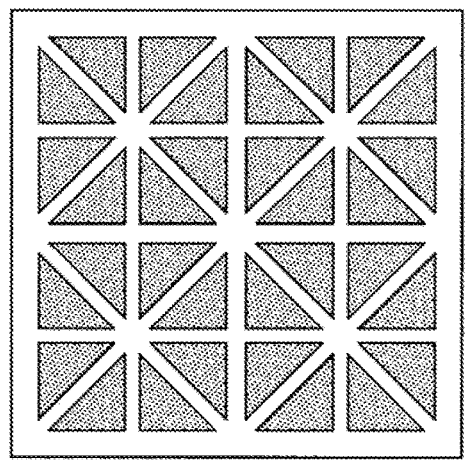
Figure 36A:
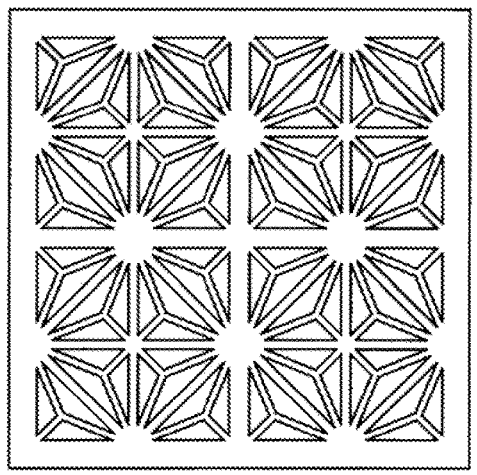
Figure 36B:
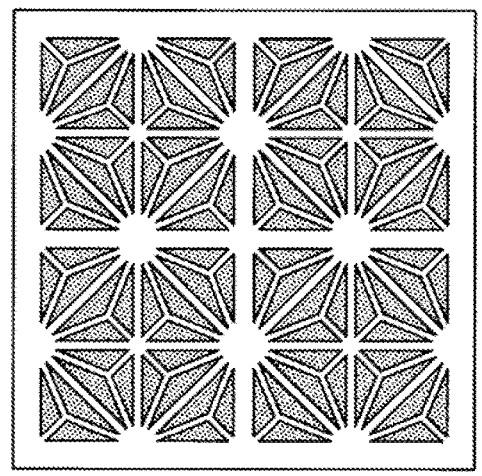
Figure 36C:
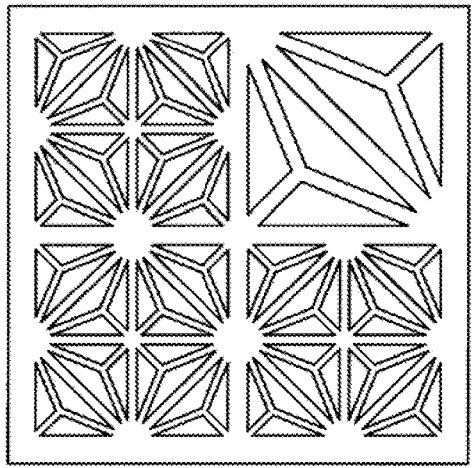
Figure 36D:
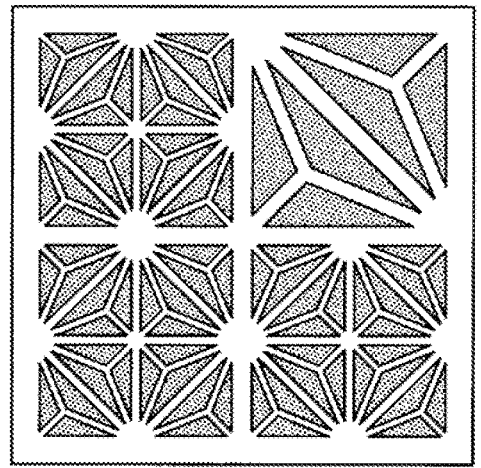

The present invention includes in addition to the above-described embodiments, a planar light source as illustrated in FIGS. 35A and 35B, a planar light source illustrated in FIGS. 35C and 35D, a planar light source illustrated in FIGS. 36A and 36B, and a planar light source illustrated in FIGS. 36C and 36D, and the like.

EXPLANATION OF REFERENCE CHARACTERS 1, 200: Illumination apparatus
2a, 2b, 250, 300, 350: Planar light source
3, 203: Mounting member
11, 251: Decorative member
12: Light emitting surface
15: Light emitting tile
16: Frame member
17: Reinforcing plate (Ferromagnetic section)
30: Light emitting region
31: Frame region
51: Main body plate section
52: Side-surface plate section
60, 252: Pattern forming section
61: Frame shielding section
62, 253, 301, 351: Light-emission shielding section
65, 66: Longitudinally extending section 67, 68: Laterally and longitudinally extending section
75, 255, 352: Lateral shielding section
76, 256, 353: Longitudinal shielding section
77a to 77d, 265a to 265d, 302a, 302b, 302d, 355b, 355d: First region
90a to 90d, 266a to 266d, 303: Second connecting shielding section (Shielding extending section)
95a to 95c, 278: Third connecting shielding section (Shielding extending section)
98a to 98c, 283a to 283d, 312a to 312e, 358a, 358b: Light transmitting hole
103, 104: Magnetic force generating section
281: Fourth connecting shielding section
282: Fifth connecting shielding section

The invention claimed is:

1. A planar light source comprising:
a planar light emitting panel having a light emitting surface; and
a decorative member covering the light emitting surface of the planar light emitting panel,
wherein the light emitting surface comprises: a light emitting region emitting planar light when the planar light source is turned on; and a non-light-emitting frame region surrounding the light emitting region,
wherein the decorative member has a pattern forming section,
wherein the pattern forming section includes in a front view:
a frame shielding section covering an entire area of the frame region; and
a light-emission shielding section extending from the frame shielding section so as to divide the light emitting region into a plurality of regions,
wherein the light-emission shielding section overlaps with the light emitting region in a front view,
wherein the light-emission shielding section comprises a plurality of light transmitting holes, the light transmitting holes being a through hole through which light from the light emitting region of the planar light emitting panel can pass,
wherein part of the light emitting region of the planar light emitting panel is laid bare through the light transmitting holes,
wherein the decorative member comprises a main body plate section including the pattern forming section, the main body plate section being thinner than the planar light emitting panel,
wherein the decorative member further comprises a side-surface plate section bent from an end section of the main body plate section,
wherein the planar light emitting panel comprises: a planar light emitting tile; and a frame member protecting the planar light emitting tile,
wherein the frame member is made of resin and has elasticity, and
wherein part of the frame member is sandwiched by an end surface of the planar light emitting tile and the side-surface plate section.

2. The planar light source according to claim 1, wherein the light-emission shielding section covers from 5% to 75% both inclusive of the light emitting region in a front view.

3. The planar light source according to claim 1, wherein the planar light emitting panel constitutes one mirror surface together with the pattern forming section when the planar light source is turned off.

4. The planar light source according to claim 1, wherein the pattern forming section has at least two of the light-emission shielding sections having an identical width, the at least two of the light-emission shielding sections dividing the light emitting region into at least three regions in a front view.

5. The planar light source according to claim 1, wherein the light-emission shielding section comprises a shielding extending section extending with a longitudinal component and a lateral component in a front view.

6. An illumination apparatus comprising:
the planar light source according to claim 1; and
a mounting member that can be fixed to a mounting surface,
wherein the mounting member has one of a magnetic force generating section and a ferromagnetic section, whereas the planar light source has the other of the magnetic force generating section and the ferromagnetic section on a back surface side, the magnetic force generating section and the ferromagnetic section forming a pair with each other, and
wherein the planar light source is fixed to the mounting member by magnetic force generated between the magnetic force generating section and the ferromagnetic section.

7. An illumination apparatus comprising a plurality of planar light sources,
the plurality of planar light sources including a first planar light source and a second planar light source, each planar light source according to claim 1,
wherein the first planar light source and the second planar light source are arranged to be adjacent to each other, and
wherein the pattern forming section of the first planar light source and the pattern forming section of the second planar light source form one pattern when the first planar light source and the second planar light source are turned on.

8. A planar light source comprising:
a planar light emitting panel having a light emitting surface; and
a decorative member covering the light emitting surface of the planar light emitting panel,
wherein the light emitting surface comprises: a light emitting region emitting planar light when the planar light source is turned on; and a non-light-emitting frame region surrounding the light emitting region,
wherein the decorative member has a pattern forming section,
wherein the pattern forming section includes in a front view:
a frame shielding section covering an entire area of the frame region; and
a light-emission shielding section extending from the frame shielding section so as to divide the light emitting region into a plurality of regions,
wherein the light-emission shielding section overlaps with the light emitting region in a front view,
wherein the light-emission shielding section comprises a plurality of light transmitting holes, the light transmitting holes being a through hole through which light from the light emitting region of the planar light emitting panel can pass,
wherein part of the light emitting region of the planar light emitting panel is laid bare through the light transmitting holes, wherein the decorative member comprises a main body plate section including the pattern forming section, the main body plate section being thinner than the planar light emitting panel, and wherein some of the regions divided by the light-emission shielding sections have a different shielding rate, the shielding rate being defined as a ratio of an area where the pattern forming section is covering the light emitting region to an total area of the light emitting region.

9. An illumination apparatus comprising: a first planar light source; and a second planar light source, the second planar light source having a pattern forming section that is different from the pattern forming section of the first planar light source, wherein the first planar light source and the second planar light source are arranged to be adjacent to each other, and wherein the first planar light source and the second planar light source have a different shielding rate, the shielding rate being defined as a ratio of an area where the pattern forming section is covering a light emitting region to an total area of the light emitting region, each of the planar light sources comprising:

a planar light emitting panel having a light emitting surface; and a decorative member covering the light emitting surface of the planar light emitting panel, wherein the light emitting surface comprises: the light emitting region emitting planar light when the planar light source is turned on; and a non-light-emitting frame region surrounding the light emitting region, wherein the decorative member has the pattern forming section, wherein the pattern forming section includes in a front view:

a frame shielding section covering an entire area of the frame region; and a light-emission shielding section extending from the frame shielding section so as to divide the light emitting region into a plurality of regions, wherein the light-emission shielding section overlaps with the light emitting region in a front view, wherein the light-emission shielding section comprises a plurality of light transmitting holes, the light transmitting holes being a through hole through which light from the light emitting region of the planar light emitting panel can pass, wherein part of the light emitting region of the planar light emitting panel is laid bare through the light transmitting holes, and wherein the decorative member comprises a main body plate section including the pattern forming section, the main body plate section being thinner than the planar light emitting panel.

10. The illumination apparatus according to claim 9, wherein the pattern forming section of the first planar light source and the pattern forming section of the second planar light source form one pattern when the first planar light source and the second planar light source are turned on.

* * * * *